US009076551B2

(12) United States Patent
Dally et al.

(10) Patent No.: US 9,076,551 B2
(45) Date of Patent: Jul. 7, 2015

(54) MULTI-PHASE GROUND-REFERENCED SINGLE-ENDED SIGNALING

(71) Applicant: NVIDIA Corporation, Santa Clara, CA (US)

(72) Inventors: William J. Dally, Los Altos Hills, CA (US); John W. Poulton, Chapel Hill, NC (US); Thomas Hastings Greer, III, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/933,058

(22) Filed: Jul. 1, 2013

(65) Prior Publication Data

US 2014/0269011 A1 Sep. 18, 2014

Related U.S. Application Data

(63) Continuation-in-part of application No. 13/844,570, filed on Mar. 15, 2013.

(51) Int. Cl.
| | |
|---|---|
| *G11C 11/24* | (2006.01) |
| *G11C 11/4096* | (2006.01) |
| *G11C 7/10* | (2006.01) |

(52) U.S. Cl.
CPC .......... *G11C 11/4096* (2013.01); *G11C 7/1057* (2013.01); *G11C 7/1069* (2013.01)

(58) Field of Classification Search
CPC .... H04B 1/0007; H03H 15/023; G11C 5/145; G11C 5/147; G11C 16/28
USPC ........ 365/149, 174, 129, 189.17, 189.09, 203
See application file for complete search history.

(56) References Cited

U.S. PATENT DOCUMENTS

| | | | |
|---|---|---|---|
| 6,125,047 | A | 9/2000 | Janz |
| 7,962,115 | B2 | 6/2011 | Huang et al. |
| 8,102,157 | B2 | 1/2012 | Abe |
| 8,395,410 | B2 | 3/2013 | Hatori |
| 8,538,558 | B1 | 9/2013 | Sabapathy et al. |
| 8,583,953 | B2 | 11/2013 | Sultenfuss |
| 8,611,437 | B2 | 12/2013 | Poulton et al. |

(Continued)

FOREIGN PATENT DOCUMENTS

CN          1647381 A      7/2005

OTHER PUBLICATIONS

Poulton, J. W. et al., "A 0.54pJ/b 20Gb/s Ground-Referenced Single-Ended Short-Haul Serial Link in 28nm CMOS for Advanced Packaging Applications," 2013 IEEE International Solid-State Circuits Conference, Feb. 17-21, 2013, pp. 404-405.
Notice of Allowance from U.S. Appl. No. 13/359,433, dated Sep. 19, 2013.
Non-Final Office Action from U.S. Appl. No. 13/359,433, dated Jul. 11, 2013.

(Continued)

*Primary Examiner* — Fernando Hidalgo
(74) *Attorney, Agent, or Firm* — Zilka-Kotab, PC

(57) ABSTRACT

A system includes a control circuit and first, second, and third ground-referenced single-ended signaling (GRS) driver circuits that are each coupled to an output signal. The control circuit is configured to generate a first, second, and third set of control signals that are each based on a respective phase of a clock signal. Each GRS driver circuit is configured to precharge a capacitor to store a charge based on the respective set of control signals during at least one phase of the clock signal and drive the output signal relative to a ground network by discharging the charge during a respective phase of the clock signal.

23 Claims, 24 Drawing Sheets

(56) References Cited

U.S. PATENT DOCUMENTS

| | | | |
|---|---|---|---|
| 8,621,131 | B2 | 12/2013 | Loh et al. |
| 8,710,920 | B2 | 4/2014 | Huang |
| 8,854,123 | B1 | 10/2014 | Dally et al. |
| 2002/0104035 | A1 | 8/2002 | Burns et al. |
| 2003/0185067 | A1 | 10/2003 | Dellow |
| 2003/0208668 | A1 | 11/2003 | To et al. |
| 2004/0114650 | A1 | 6/2004 | Tanaka et al. |
| 2005/0207234 | A1 | 9/2005 | Baechtold et al. |
| 2006/0232311 | A1 | 10/2006 | Kitayama |
| 2007/0210835 | A1 | 9/2007 | Aghtar |
| 2007/0211711 | A1 | 9/2007 | Clayton |
| 2008/0189457 | A1 | 8/2008 | Dreps et al. |
| 2008/0212347 | A1 | 9/2008 | Mok et al. |
| 2008/0311702 | A1 | 12/2008 | Wark |
| 2009/0002066 | A1 | 1/2009 | Lee et al. |
| 2009/0189681 | A1 | 7/2009 | Ivanov et al. |
| 2010/0046266 | A1 | 2/2010 | Bruennert et al. |
| 2010/0220541 | A1 | 9/2010 | Gebara et al. |
| 2011/0128071 | A1 | 6/2011 | Fukusen et al. |
| 2011/0199122 | A1* | 8/2011 | Morishita et al. .............. 327/2 |
| 2012/0163071 | A1 | 6/2012 | Kurokawa |
| 2013/0194031 | A1 | 8/2013 | Poulton et al. |
| 2013/0328597 | A1* | 12/2013 | Cassia .......................... 327/109 |
| 2014/0036596 | A1* | 2/2014 | Chan et al. ............... 365/185.21 |
| 2014/0044159 | A1 | 2/2014 | Poulton et al. |
| 2014/0266416 | A1 | 9/2014 | Dally et al. |
| 2014/0266417 | A1 | 9/2014 | Dally et al. |
| 2014/0268976 | A1 | 9/2014 | Dally et al. |
| 2014/0269010 | A1 | 9/2014 | Dally |
| 2014/0269012 | A1 | 9/2014 | Dally et al. |
| 2014/0281383 | A1 | 9/2014 | Dally et al. |

OTHER PUBLICATIONS

Non-Final Office Action from U.S. Appl. No. 14/055,823, dated Sep. 10, 2014.
Final Office Action from U.S. Appl. No. 13/361,843, dated Oct. 18, 2013.
Non-Final Office Action from U.S. Appl. No. 13/361,843, dated Aug. 13, 2013.
Non-Final Office Action from U.S. Appl. No. 13/361,843, dated Mar. 27, 2013.
Notice of Allowance from U.S. Appl. No. 13/946,980, dated Jun. 9, 2014.
Non-Final Office Action from U.S. Appl. No. 13/933,058, dated Jun. 27, 2014.
Office Action from Chinese Patent Application No. 201210457686.8, dated Jul. 23, 2014.
Non-Final Office Action from U.S. Appl. No. 13/361,843, dated Jan. 5, 2015.
Non-Final Office Action from U.S. Appl. No. 13/890,899, dated Dec. 4, 2014.
Non-Final Office Action from U.S. Appl. No. 13/938,161, Dec. 4, 2014.
Notice of Allowance from U.S. Appl. No. 14/055,823, dated Feb. 23, 2015.
Notice of Allowance from U.S. Appl. No. 13/844,570, dated Mar. 19, 2015.
Non-Final Office Action from U.S. Appl. No. 13/973,947, dated Feb. 4, 2015.
Non-Final Office Action from U.S. Appl. No. 13/973,952, dated Jan. 22, 2015.
Notice of Allowance from U.S. Appl. No. 13/890,899, dated May 14, 2015.

* cited by examiner

GRS Data Driver 400

Pre-Charge with Data = 0

Pre-Charge with Data = 1

US 9,076,551 B2

MULTI-PHASE GROUND-REFERENCED SINGLE-ENDED SIGNALING

CLAIM OF PRIORITY

This application is a continuation-in-part of U.S. application Ser. No. 13/844,570, filed Mar. 15, 2013, the entire contents of which is incorporated herein by reference.

This invention was made with Government support under Agreement No. HR0011-10-9-0008 awarded by DARPA, and under LLNS subcontract B599861 awarded by DOE. The Government has certain rights in the invention.

FIELD OF THE INVENTION

The present invention relates to digital signaling, and more specifically to ground-referenced single-ended signaling.

BACKGROUND

Sequential generations of computing systems typically require higher performance and, in many cases, reduced size and reduced overall power consumption. A typical computing system includes a central processing unit, a graphics processing unit, and a high-capacity memory subsystem, such as one or more dynamic random access memory (DRAM) devices. Conventional computing systems integrate one or more central processing unit cores and one or more graphics processing unit cores on a single processor system chip that is coupled to one or more DRAM chips. In certain highly-integrated computing systems, the processor system chip is packaged with one or more DRAM chips in a multi-chip module (MCM), which includes interconnection traces to couple the processor system chip to the DRAM chips.

Differential signaling is typically preferred over single-ended signaling for high-speed channels within the MCM because conventional differential signaling may be implemented to dissipate less power, generate less supply noise, and exhibit superior noise rejection properties compared to conventional single-ended signaling. However, differential signals require two input/output pads on each interconnected chip and well-matched interconnection traces per digital signal. By contrast, single-ended signals only require one signal pad per digital signal. However, conventional single-ended drivers draw data-dependent supply current, resulting in symbol-rate simultaneous switching noise (SSN) on an associated power supply network. SSN is proportional to signal level and can be overcome by reducing power supply inductance, a relatively expensive solution that typically requires additional input/output pads. Conventional single-ended signaling is also highly susceptible to electromagnetic noise because such noise is indistinguishable relative to an incoming signal.

Conventional differential signaling exhibits excellent noise characteristics, but is expensive in terms of interconnect resources. While conventional single-ended signaling requires fewer signal traces and fewer input/output pads, conventional single-ended drivers generate more SSN and conventional single-ended receivers have poor noise tolerance, especially at lower voltage swings needed for low-power operation. Thus, conventional single-ended and differential signaling both have drawbacks.

Thus, there is a need for improving signaling and/or other issues associated with the prior art.

SUMMARY

A system is provided for transmitting a ground-referenced single-ended signal (GRS). The system includes a control circuit and a first, second, and third GRS driver circuit. The control circuit is configured to generate a first set of control signals based on a first phase of a clock signal, a second set of control signals based on a second phase of the clock signal, and a third set of control signals based on a third phase of the clock signal. The first GRS driver circuit is configured to pre-charge a first capacitor to store a first charge based on the first set of control signals during at least one phase of the clock signal other than the first phase of the clock signal and drive an output signal relative to a ground network by discharging the first charge during the first phase of the clock signal. The second GRS driver circuit is configured to pre-charge a second capacitor to store a second charge based on the second set of control signals during at least one phase of the clock signal other than the second phase of the clock signal and drive the output signal relative to the ground network by discharging the second charge during the second phase of the clock signal. A third GRS driver circuit is configured to pre-charge a third capacitor to store a third charge based on the third set of control signals during at least one phase of the clock signal other than the third phase of the clock signal and drive the output signal relative to the ground network by discharging the third charge during the third phase of the clock signal.

DETAILED DESCRIPTION

Figure 1A:
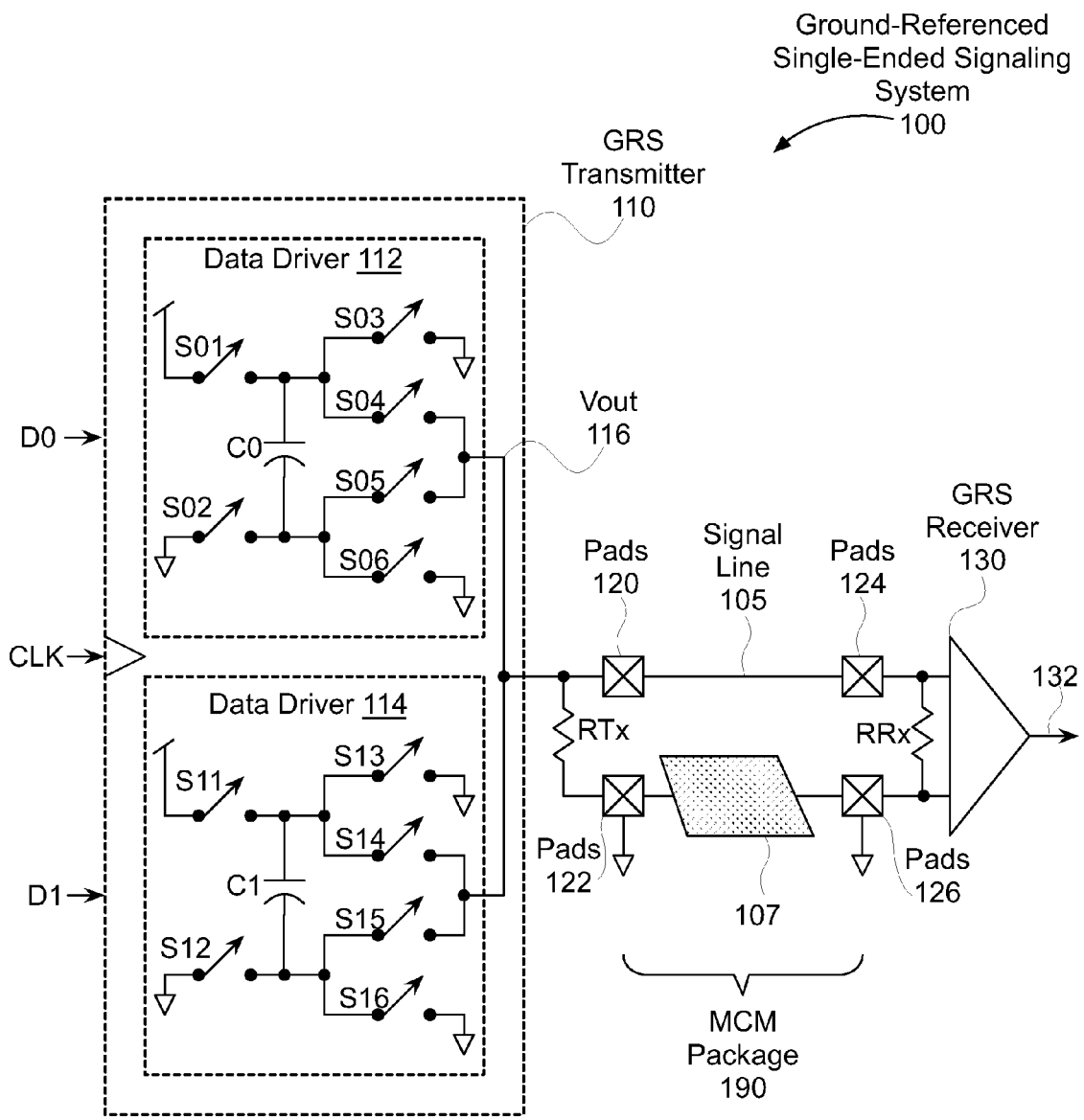
FIG. 1A illustrates a ground-referenced single-ended signaling (GRS) system that implements a GRS transmitter based on a flying capacitor charge pump, in accordance with one embodiment.

A technique is provided for high-speed, single-ended signaling between a processor and memory devices. A ground-referenced driver transmits a pulse having a polarity determined by a corresponding logic state. The pulse traverses a signal path and is received by a ground-referenced amplifier, which amplifies the pulse for interpretation as a conventional logic signal. A set of ground-referenced drivers and ground-referenced amplifiers implement a high-speed interface within the processor and a corresponding interface within one or more memory devices coupled to the processor. The high-speed interface advantageously improves memory bandwidth within the processor, enabling higher performance and higher density systems than provided by conventional memory signaling techniques.

Embodiments of the present invention implement a multi-phase system comprising multiple transmitter circuits and corresponding receiver circuits that operate over different phases of a clock signal to transmit data during each of the phases. Transmitting data over multiple phases enables the transmission of data at higher rates. Some multi-phase systems may suffer from fixed-pattern jitter resulting from timing mismatches between the different phases. Signals encoding the multiple phases of the clock signal may be forwarded along with the data and used to sample the data to reduce the effects of fixed-pattern jitter.

A ground-referenced single-ended signaling (GRS) link implements a charge pump driver configured to transmit a ground-referenced pulse on an associated signal line. In one implementation, a pulse of positive charge indicates a logical one, while a pulse of negative charge indicates a logical zero. The charge pump driver eliminates simultaneous switching noise (SSN) commonly associated with single-ended signaling by forcing transient signal current and ground current to be locally balanced, and by drawing a constant amount of charge from the power supply each half clock cycle, independent of the data being transmitted. The pulse is received and amplified by a common gate amplifier stage configured to use a local ground signal as an input reference. This configuration provides substantial immunity to common mode noise, the dominant source of transmission errors in single-ended signaling. A second amplifier stage translates a given received pulse to full-swing logic voltages, allowing the received pulse to be properly interpreted as one or two logic states by conventional logic circuitry. In one embodiment, a GRS receiver comprises a common gate amplifier stage, the second amplifier stage, and two storage elements, such as flip-flops, configured to capture received data during alternate clock phases.

A GRS transceiver includes a GRS data driver and a GRS receiver. The GRS transceiver transmits outbound data through the GRS data driver and receives inbound data through the GRS receiver. An isochronous GRS transceiver may also transmit clocking information having a fixed phase relationship to the outbound data and receives clocking information having a fixed phase relationship to the inbound data.

FIG. 1A illustrates a ground-referenced single-ended signaling (GRS) system 100 that implements a GRS transmitter 110 based on a flying capacitor charge pump, in accordance with one embodiment. GRS system 100 includes GRS transmitter 110, a transmission path comprising a signal line 105 and a ground network 107, and a GRS receiver 130. In one embodiment, GRS transmitter 110 comprises two data drivers 112, 114. Input data signals D0 and D1 are presented to GRS transmitter 110 based on a clock signal CLK. Data driver 112 is configured to capture a logic state associated with input D0 and drive output signal Vout 116 onto signal line 105 with a pulse corresponding to the logic state of input D0 while CLK is low. Similarly, data driver 114 is configured to capture a logic state associated with input D1 and drive output signal Vout 116 onto signal line 105 with a pulse corresponding to the logic state of D1 while CLK is high. A sequence of pulses is formed along signal line 105 corresponding to a sequence of input data from inputs D0 and D1. The sequence of pulses is referenced to ground with a voltage swing that may be lower than conventional logic voltage swings. GRS receiver 130 is configured to amplify an incoming sequence of pulses from signal line 105 and translate the pulses to a conventional logic voltage swing so the pulses may be properly interpreted as logic signals on amplifier output signal 132. For example, the sequence of pulses along signal line 105 may have a nominal amplitude of plus or minus one-hundred millivolts, while amplifier output signal 132 may have a corresponding voltage swing of twelve hundred millivolts to zero volts with respect to ground if logic coupled to amplifier output signal 132 operates on a twelve hundred millivolt positive supply rail.

In one embodiment, GRS transmitter 110 is fabricated on a transmitter chip and GRS receiver 130 is fabricated on a receiver chip distinct from the transmitter chip. Pads 120 comprise bonding pads configured to couple output signal Vout 116 from the transmitter chip to signal line 105, which is fabricated as an impedance-controlled trace within a multichip module (MCM) package 190. Pads 122 comprise bonding pads configured to couple a local ground signal within the transmitter chip to ground network 107, fabricated within MCM package 190. Similarly, pads 124 comprise bonding pads configured to couple signal line 105 to an input signal for GRS receiver 130 within the receiver chip, and pads 126 comprise bonding pads configured to couple ground network 107 to a local ground within the receiver chip. A termination resistor RTx is coupled between output signal Vout 116 and the local ground within the transmitter chip to absorb incoming signals, such as reflections or induced noise signals. A termination resistor RRx is coupled across inputs to GRS receiver 130 to similarly absorb incoming signals at the receiver chip.

Data driver 112 comprises capacitor C0, and switches S01 through S06. Switch S01 enables a first node of capacitor C0 to be coupled to a positive supply rail, while switch S02 enables a second node of capacitor C0 to be coupled to a local ground net. Switches S01 and S02 are active (closed) during a pre-charge state for data driver 112, defined when CLK is equal to a logical "1" value. Switch S03 enables the first node of capacitor C0 to be coupled to GND, while switch S06 enables the second node of capacitor C0 to be coupled to GND. Switch S04 enables the first node of capacitor C0 to be coupled to Vout 116, while switch S05 enables the second node of capacitor C0 to be coupled to Vout 116. When CLK is equal to a logical "0" value, switches S04 and S06 are active when data driver 112 is driving a logical "1" value to Vout 116, or switches S03 and S05 are active when data driver 112 is driving a logical "0" value to Vout 116. Data driver 114 comprises a substantially identical circuit topology, with an inverted sense for CLK, so that data driver 114 is in a pre-charge state when CLK is equal to a logical "0" value and driving Vout 116 when CLK is equal to a logical "1" value.

In one embodiment, switches S01 through S06 and switches S11 through S16 are fabricated using monolithic complementary metal-oxide semiconductor (CMOS) devices, such as enhancement mode n-channel and p-channel field-effect transistors. Any technically feasible logic circuit topologies may be implemented to drive switches S01-S06 and switches S11-S16 into individually active or inactive states without departing the scope and spirit of embodiments of the present invention.

Figure 1B:
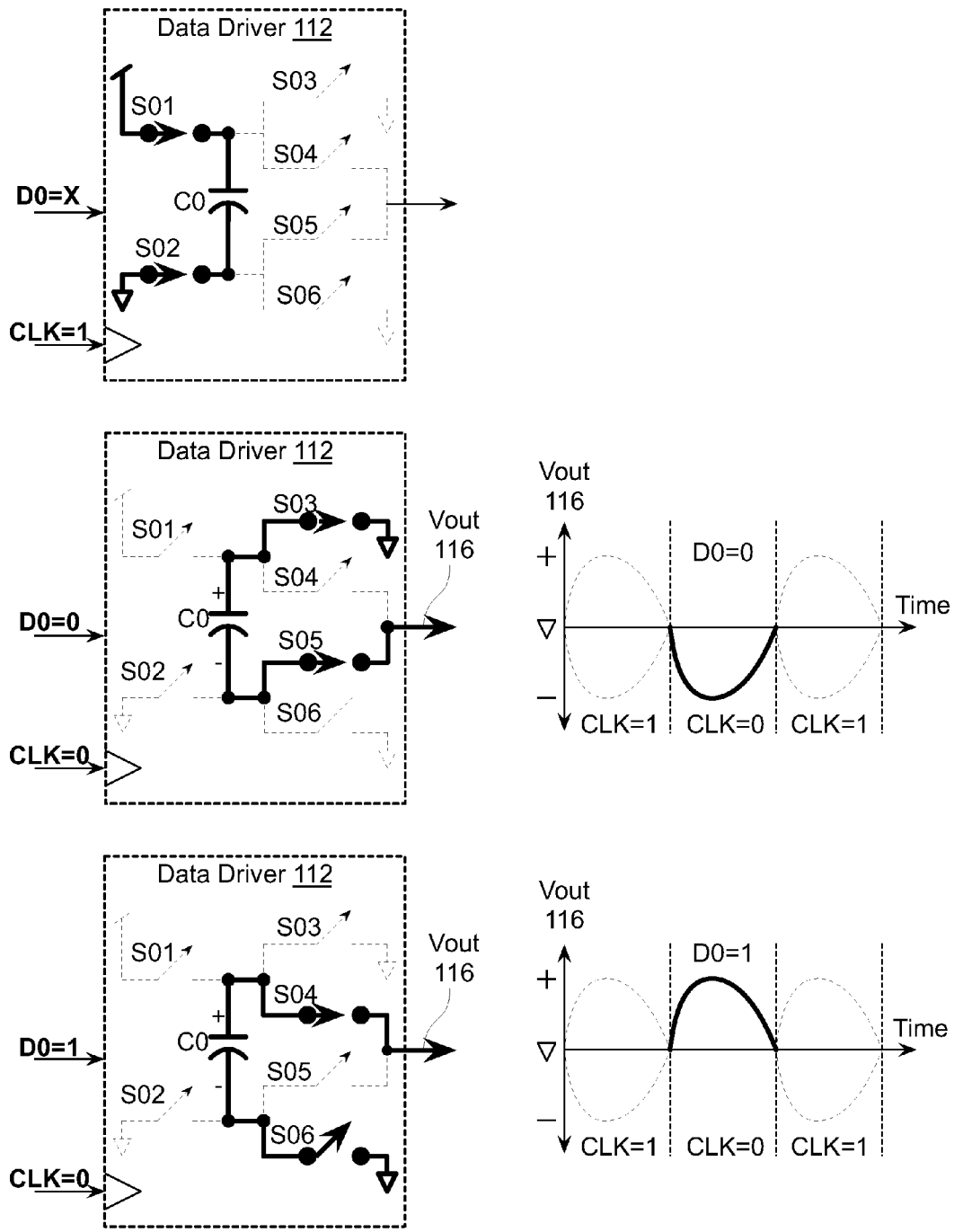
FIG. 1B illustrates operation of a data driver in a pre-charge state and in two different data-dependent drive states, in accordance with one embodiment.

FIG. 1B illustrates operation of a data driver 112 in a pre-charge state and in two different data-dependent drive states, in accordance with one embodiment. As shown, when CLK is equal to a logical "1" value, data driver 112 is in a pre-charge state, whereby switches S01 and S02 are active and capacitor C0 charges to a voltage corresponding approximately to a positive supply rail, such as a "VDD" supply rail. All of switches S03-S06 are inactive (open) during the pre-charge state. When CLK is equal to a logical "0" value, two of switches S03-S06 are configured to couple capacitor C0 to Vout 116 to transmit a pulse having a polarity corresponding to a logical value for D0. To drive a logical "0" value, switches S03 and S05 are driven active, thereby coupling a negative charge relative to ground onto Vout 116. To drive a logical "1" value, switches S04 and S06 are driven active, thereby coupling a positive charge relative to ground onto Vout 116.

Figure 1C:
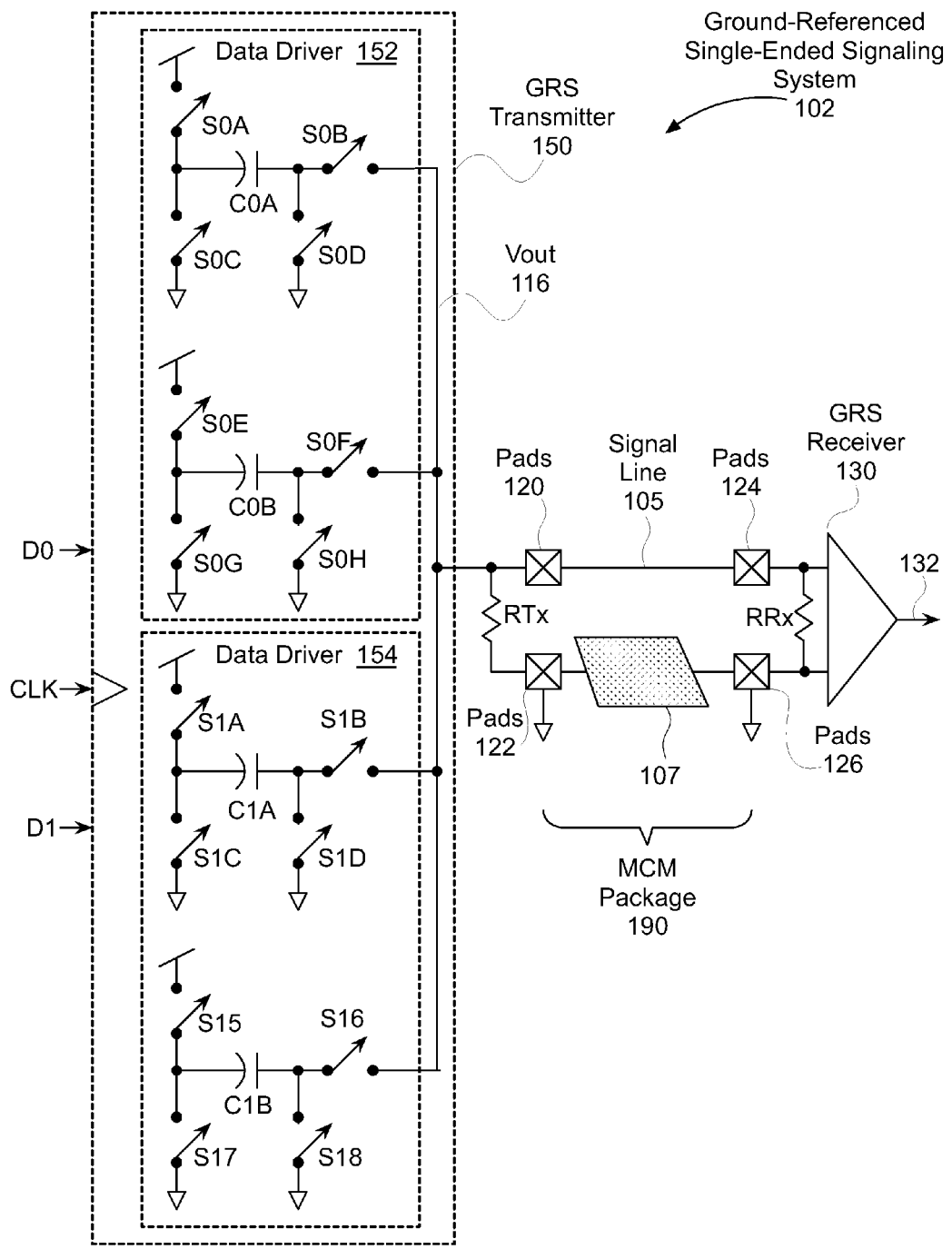
FIG. 1C illustrates a GRS system that implements a GRS transmitter based on a dual-capacitor charge pump, in accordance with one embodiment.

FIG. 1C illustrates a GRS system 102 that implements a GRS transmitter 150 based on a dual-capacitor charge pump, in accordance with one embodiment. GRS system 102 includes GRS transmitter 150, a transmission path comprising a signal line 105 and a ground network 107, and a GRS receiver 130. In one embodiment, GRS transmitter 150 comprises two data drivers 152 and 154. Operation of GRS system 102 is substantially identical to the operation of GRS system 100 described above in FIGS. 1A and 1B, with the exception of the internal topology and operation of data drivers 152 and 154.

Data driver 152 comprises capacitors C0A and C0B, as well as switches S0A through S0H. Switch S0A enables a first node of capacitor C0A to be coupled to a positive supply rail, while switch S0C enables the first node to be coupled to a local ground net. Switch S0B enables a second node of capacitor C0A to be coupled to Vout 116, while switch S0D enables the second node to be coupled to the local ground net. Similarly, switch S0E enables a first node of capacitor C0B to be coupled to the positive supply rail, while switch S0G enables the first node to be coupled to the local ground net. Switch S0F enables a second node of capacitor C0B to be coupled to Vout 116, while switch S0H enables the second node to be coupled to the local ground net.

A pre-charge state for data driver 152 is defined when CLK is equal to a logical "1" value. During the pre-charge state, switches S0A, S0D, S0G, and S0H are driven active, pre-charging capacitor C0A to a voltage corresponding to the positive supply rail relative to the local ground net, and pre-charging capacitor C0B to have approximately no charge. When CLK is equal to a logical "0" value, either capacitor C0A is coupled to Vout 116 to generate a negative pulse or capacitor C0B is coupled to Vout 116 to generate a positive pulse, as described below in conjunction with FIG. 1E. Data driver 154 comprises a substantially identical circuit topology, with an inverted sense for CLK, so that data driver 154 is in a pre-charge state when CLK is equal to a logical "0" value and driving Vout 116 when CLK is equal to a logical "1" value.

In one embodiment, switches S0A through S0H and switches S1A through S1H are fabricated using monolithic CMOS devices, such as enhancement mode n-channel and p-channel FETs. Any technically feasible logic circuit topologies may be implemented to drive switches S0A-S0H and switches S1A-S1H into individually active or inactive states without departing the scope and spirit of embodiments of the present invention.

Figure 1D:
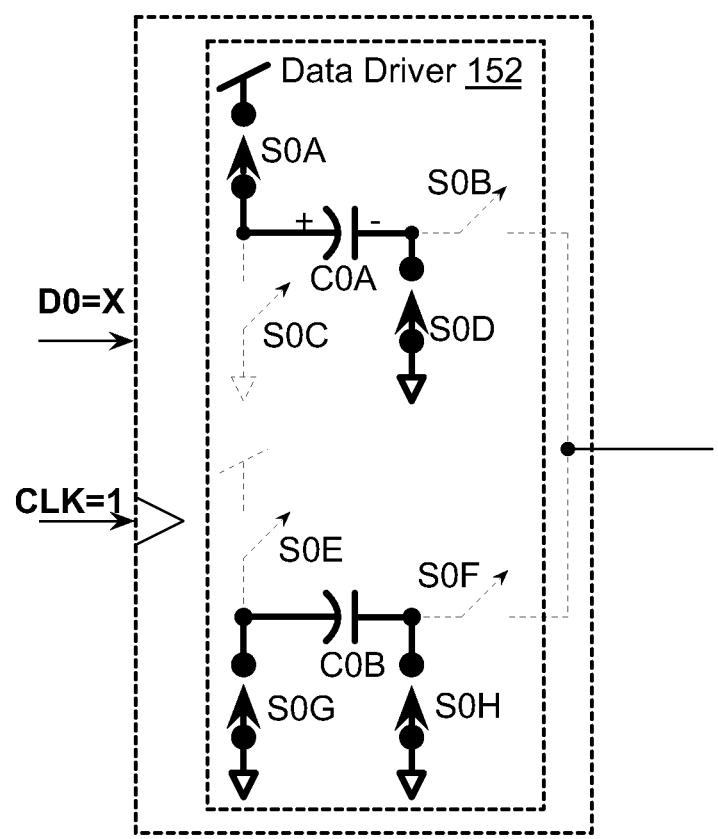
FIG. 1D illustrates operation of a data driver in a pre-charge state, in accordance with one embodiment.

FIG. 1D illustrates operation of data driver 152 in a pre-charge state, in accordance with one embodiment. As shown, when CLK is equal to a logical "1" value, switch S0A is active, coupling a first node of capacitor C0A to a positive supply rail, and switch S0D is active, coupling a second node of capacitor C0A to a local ground net. At the same time, switch S0G is active, coupling a first node of capacitor C0B to ground, and switch S0H is active, coupling a second node of capacitor C0B to ground. By the end of this pre-charge state, capacitor C0B is substantially discharged.

Figure 1E:
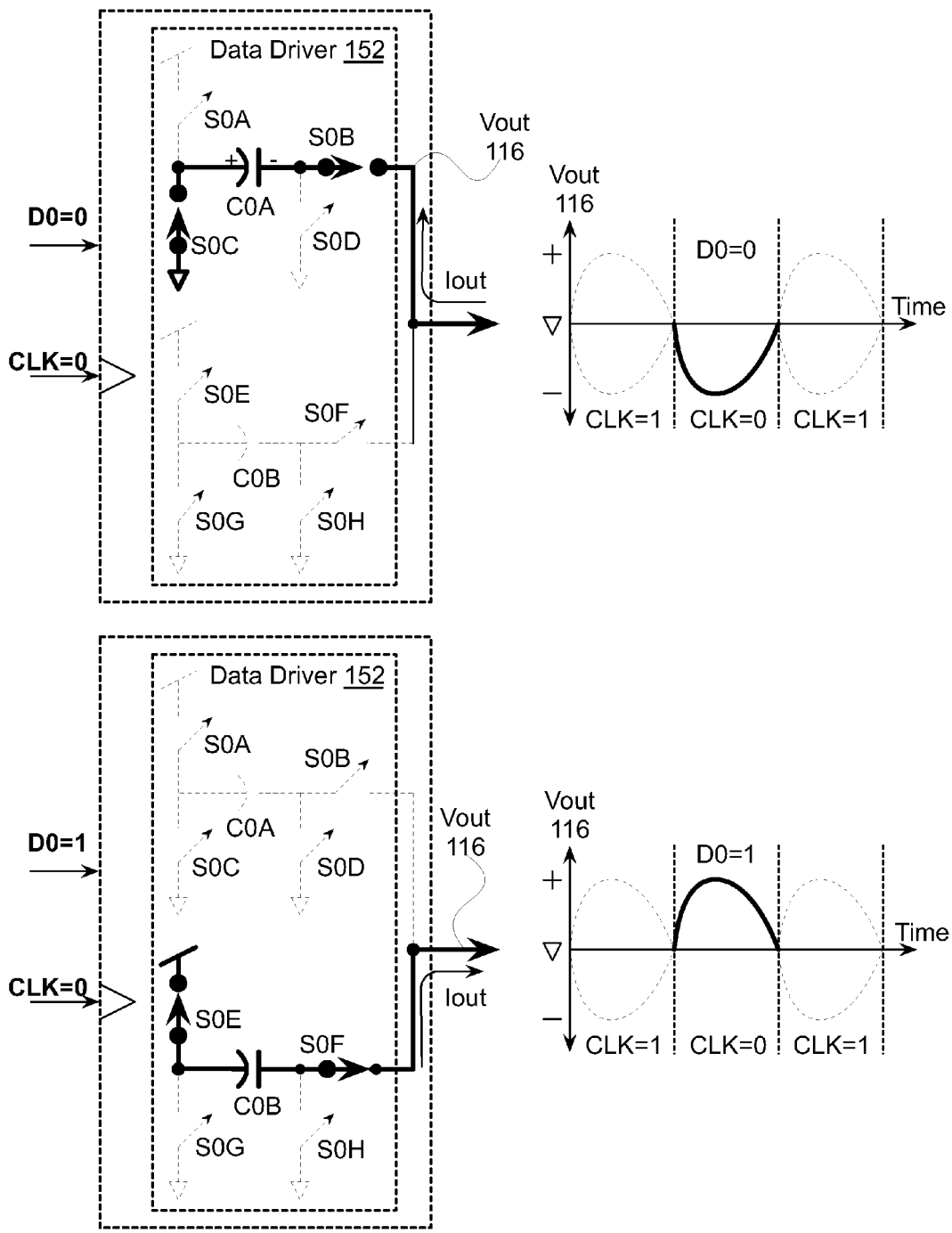
FIG. 1E illustrates operation of a data driver in different data-dependent drive states, in accordance with one embodiment.

FIG. 1E illustrates operation of data driver 152 in different data-dependent drive states, in accordance with one embodiment. As shown, when CLK is equal to a logical "0" value and D0 is equal to a logical "0" value, switches S0C and S0B are configured to couple capacitor C0A to Vout 116 to transmit a pulse having a negative polarity. Alternatively, when CLK is equal to a logical "0" value and D0 is equal to a logical "1" value, switches S0E and S0F are configured to couple capacitor C0B to Vout 116 to transmit a pulse having a positive polarity. Here, the positive supply rail is assumed to have adequate high-frequency capacitive coupling to the local ground net to force transient return current through the local ground net in conjunction with driving Vout 116 with a positive pulse.

More illustrative information will now be set forth regarding various optional architectures and features with which the foregoing framework may or may not be implemented, per the desires of a designer or user. It should be strongly noted that the following information is set forth for illustrative purposes and should not be construed as limiting in any manner. Any of the following features may be optionally incorporated with or without the exclusion of other features described.

Figure 1F:
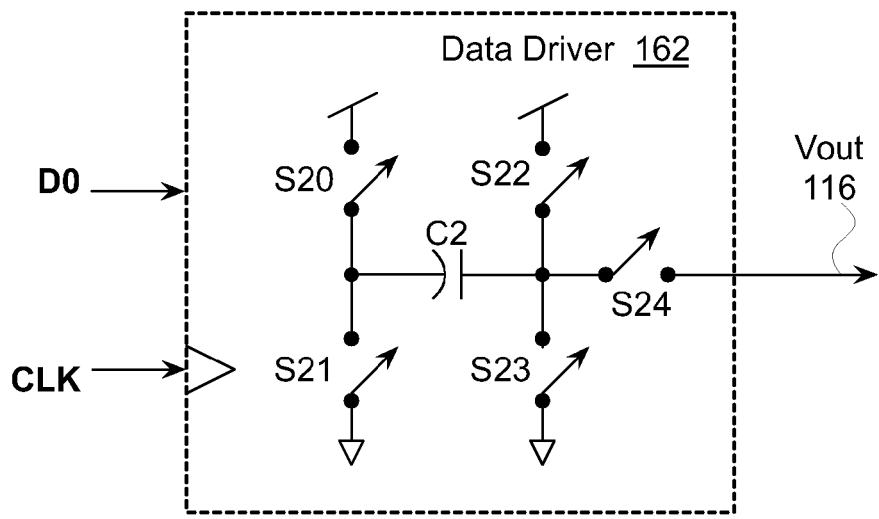
FIG. 1F illustrates operation of a ground-referenced single-ended data driver based on a flying capacitor charge pump, in accordance with one embodiment.

FIG. 1F illustrates operation of a ground-referenced single-ended data driver 162 based on a flying capacitor charge pump, in accordance with one embodiment. One or more instances of data driver 162 may be configured to operate as data drivers within a GRS transmitter. For example, an instance of data driver 162 may be configured to operate in place of data driver 112 within GRS transmitter 110 of FIG. 1A. Similarly, an instance of data driver 162 may be configured to operate in place of data driver 114.

Data driver 162 includes capacitor C2, and switches S20, S21, S22, S23, and S24, configured to pre-charge capacitor C2 during a pre-charge phase, and discharge capacitor C2 into Vout 116 during a data output phase. In one embodiment, a first instance of data driver 162 is configured to operate in a pre-charge phase when a clock signal is in a logical "0" state and a data output phase when the clock signal is in a logical "1" state. A second instance of data driver 162 is configured to operate in a pre-charge phase when the clock signal is in a logical "1" state and a data output phase when the clock signal is in a logical "0" state.

When each instance of data driver 162 is in the pre-charge phase, if D0 is in a logical "1" state, then switches S22 and S21 are active, while switches S20, S23, and S24 are inactive. While in the pre-charge phase, if D0 is in a logical "0" state, then switches S20 and S23 are active, while switches S21, S22, and S24 are inactive. During a data output phase, switches S21 and S24 are active, while switches S20, S22, and S23 are inactive. In sum, flying capacitor C2 is pre-charged with either a positive or negative polarity charge during the pre-charge phase. The charge is then discharged through ground and Vout 116 during the data output phase.

Figure 1G:
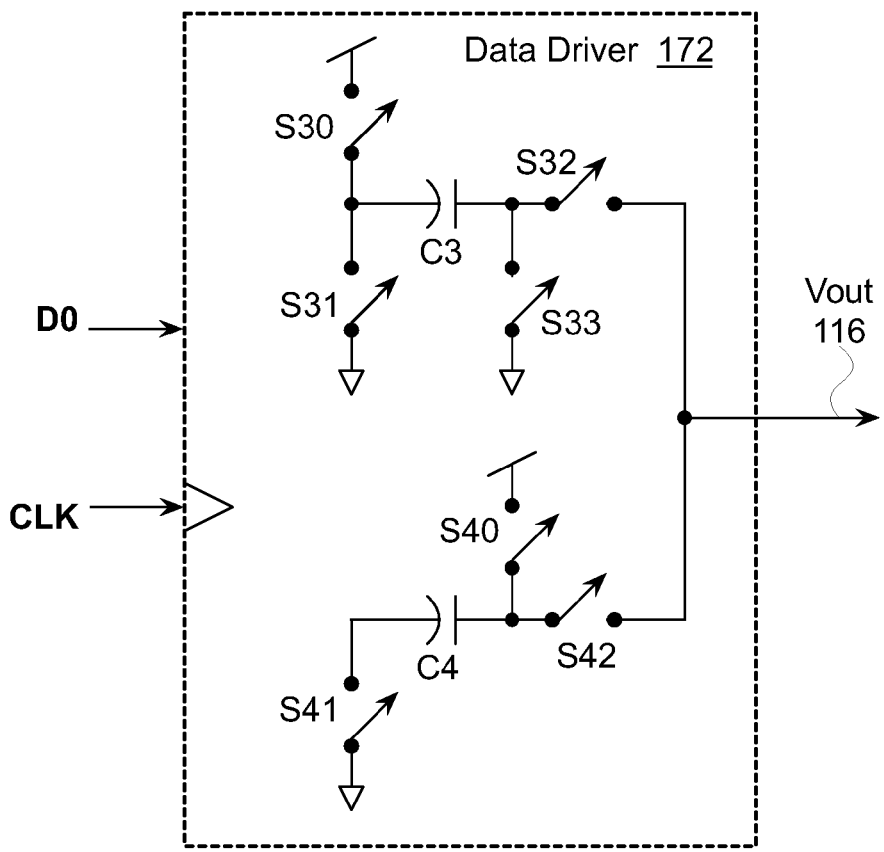
FIG. 1G illustrates operation of a ground-referenced single-ended data driver based on a dual capacitor charge pump, in accordance with one embodiment.

FIG. 1G illustrates operation of a ground-referenced single-ended data driver 172 based on a dual capacitor charge pump, in accordance with one embodiment. One or more instances of data driver 172 may be configured to operate as data drivers within a GRS transmitter. For example, an instance of data driver 172 may be configured to operate in place of data driver 112 within GRS transmitter 110 of FIG. 1A. Similarly, an instance of data driver 162 may be configured to operate in place of data driver 114.

Data driver 172 includes capacitors C3, C4, and switches S30, S31, S32, S33, S40, S41, and S42, configured to pre-charge capacitors C3 and C4 during a pre-charge phase, and discharge one of capacitors C3, C4 into Vout 116 during a data output phase. In one embodiment, a first instance of data driver 172 is configured to operate in a pre-charge phase when a clock signal is in a logical "0" state and a data output phase when the clock signal is in a logical "1" state. A second instance of data driver 172 is configured to operate in a pre-charge phase when the clock signal is in a logical "1" state and a data output phase when the clock signal is in a logical "0" state.

When each instance of data driver 172 is in the pre-charge phase, switches S30, S33, S40, and S41 are active, and switches S31, S32, and S42 are inactive. During the data output phase, if D0 is in a logical "0" state, then switches S31 and S32 are active, allowing capacitor C3 to discharge a negative polarity charge into Vout 116. At the same time, switches S30, S33, and S40-S42 are inactive. During the data output phase, if D0 is in a logical "1" state, then switches S41 and S42 are active, allowing capacitor C4 to discharge a positive polarity charge into Vout 116. At the same time, switches S40 and S30-S33 are inactive.

Figure 2A:
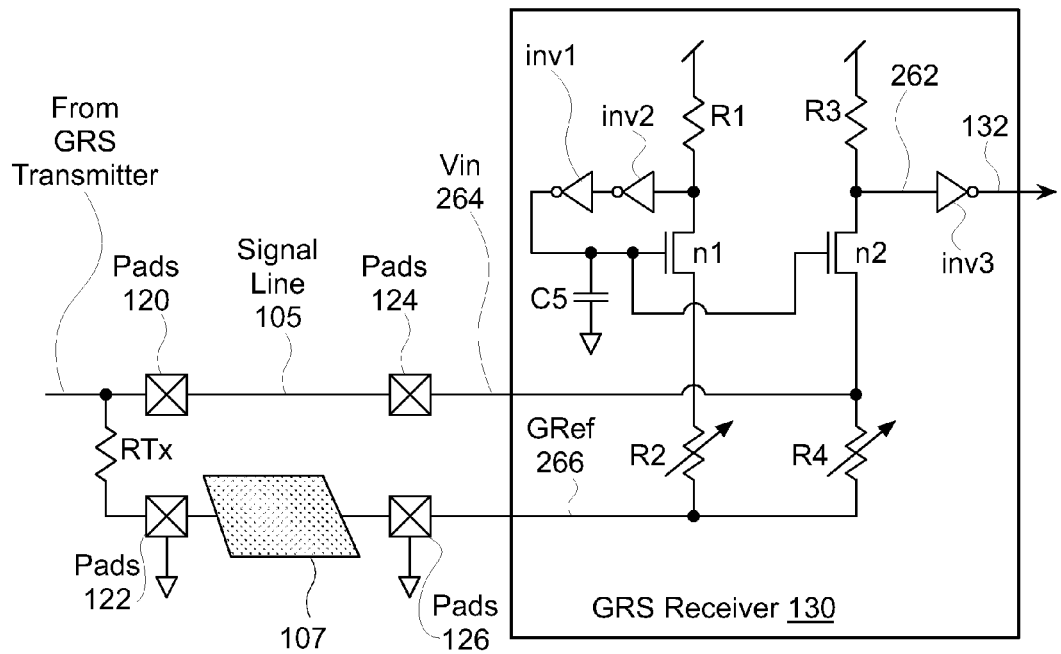
FIG. 2A illustrates an exemplary ground-referenced single-ended receiver, in accordance with one embodiment.

FIG. 2A illustrates an exemplary GRS receiver 130, in accordance with one embodiment. As shown, GRS receiver 130 receives input signals Vin 264 and GRef 266, and generates amplifier output signal 132. In one embodiment, an arriving pulse at Vin 264 having a positive voltage with respect to GRef 266 represents a logical "1" and an arriving pulse at Vin 264 having a negative voltage with respect to GRef 266 represents a logical "0". GRS receiver 130 amplifies a differential voltage between input signals Vin 264 and GRef 266 to generate a corresponding difference signal 262. In one embodiment, GRS receiver 130 is designed to bias difference signal 262 to be centered about a switching threshold for inverter inv3, which amplifies difference signal 262 to generate amplifier output signal 132 according to conventional logic voltage levels.

In one embodiment, GRS receiver 130 comprises resistors R1 through R4, inverters inv1 through inv3, capacitor C5, and field-effect transistors n1 and n2. Resistors R2 and R4 may be implemented as variable resistors, using any technically feasible technique. One exemplary implementation of a variable resistor provides digital control of a resistance value and comprises a set of n-channel FETs connected in a parallel configuration. Each n-channel FET is controlled by a different digital control signal from a control word used to establish the resistance value. If the control word is defined to be a binary number, a corresponding resistance value for the set of n-channel FETs may be monotonic if the n-channel FETs are sized appropriately. In a practical implementation, resistors R2 and R4 are tuned to balance the termination of incoming pulses and current injected into Vin 264 and GRef 266 by GRS receiver 130. A monotonic mapping from a binary code word to a resistance value simplifies any required digital trimming needed to achieve balanced termination. Any technically feasible technique may be implemented to adjust resistors R2 and R4 to achieve balanced termination.

Resistors R1 and R3 may also be implemented using any technically feasible technique. For example, resistors R1 and R3 may be implemented as p-channel FETs that are biased appropriately. Inverters inv1 and inv2 provide gain, while capacitor C5 serves to stabilize a loop formed by inverters inv1 and inv2, in conjunction with resistor R1 and FET n1.

Figure 2B:
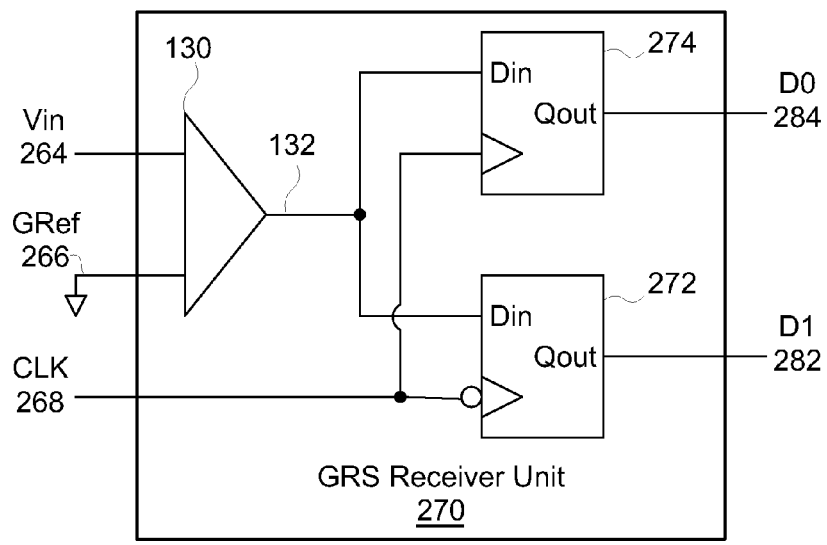
FIG. 2B illustrates an exemplary ground-referenced single-ended receiver, configured to demultiplex incoming data, in accordance with one embodiment.

FIG. 2B illustrates an exemplary GRS receiver unit 270, configured to demultiplex incoming data, in accordance with one embodiment. GRS receiver unit 270 comprises a GRS receiver 130, and storage elements configured to capture and store the logic state of amplifier output signal 132 on alternating clock phases to demultiplex input data represented as arriving pulses on input signal Vin 264, referenced to input signal GRef 266. Each output signal D0 284 and D1 282 presents captured input data at half the frequency of the arriving data pulses.

In one embodiment, the storage elements comprise a positive edge triggered flip-flop 274 and a negative edge triggered flip-flop 272. As shown, positive edge triggered flip-flop 274 is configured to capture D0 during the rising edge of a clock signal CLK 268, while negative edge triggered flip-flop 272 is configured to capture D1 during a falling edge of CLK 268. Such a configuration assumes that CLK 268 and amplifier output signal 132 transition together and that flip-flops 272 and 274 require more setup time than hold time. In alternative embodiments, D0 is captured on a falling edge of CLK 268, while D1 is captured on a rising edge of CLK 268. In other alternative embodiments, the storage elements comprise level-sensitive latches rather than flip-flops.

Figure 3:
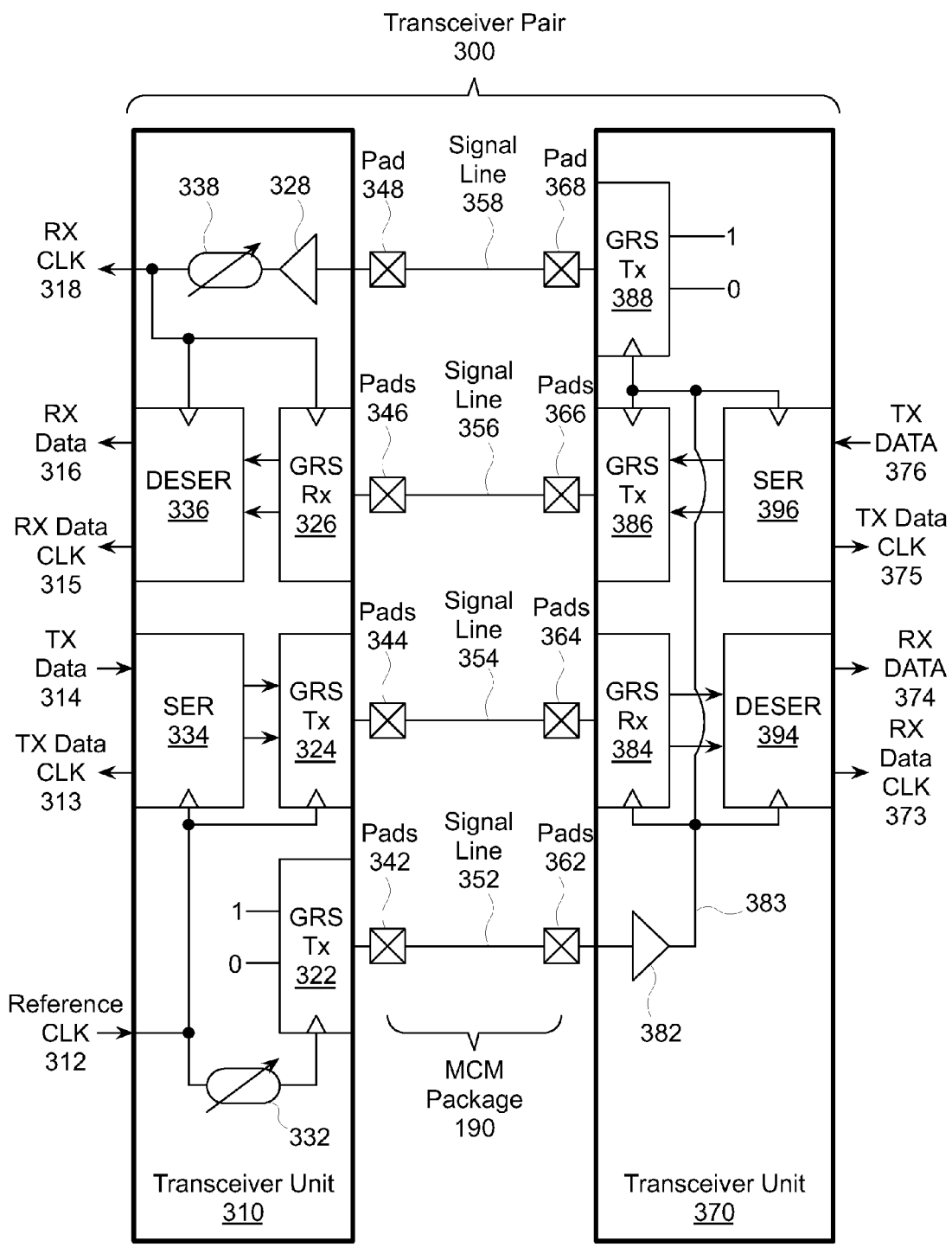
FIG. 3 illustrates an exemplary transceiver pair, configured to implement ground-referenced single-ended signaling, in accordance with one embodiment.

FIG. 3 illustrates an exemplary transceiver pair 300, configured to implement GRS signaling, in accordance with one embodiment. As shown, the transceiver pair 300 includes transceiver unit 310 coupled to transceiver unit 370 through signal lines 352, 354, 356, and 358. Signal lines 352, 354, 356, and 358 may be manufactured as controlled-impedance traces embedded within an MCM package 190. Transceiver 310 is configured to receive a reference clock 312 operating at one half the data transmission rate for the signal lines. Adjustable phase delay 332 may introduce an adjustable phase delay prior to transmitting reference clock 312 to GRS transmitter 322, GRS transmitter 324, and serializer 334.

As shown, the GRS transmitter 322 is configured to transmit a sequential "01" pattern to the GRS receiver 382 through pads 342, signal line 352, and pads 362. In one embodiment, this "01" pattern is transmitted at substantially the same phase as data transmitted from the GRS transmitter 324 to GRS receiver 384 through pads 344, signal line 354, and pads 364. Serializer 334 receives transmit data 314 at a lower frequency than reference clock 312, but at a correspondingly wider parallel width. For example, if reference clock 312 is configured to operate at 10 GHz, and serializer 334 is configured to multiplex a sixteen bit word into two bits for transmission through GRS transmitter 324, then sixteen bit words may arrive at a rate of 10 GHz divided by eight or 1.25 GHz. Here, a transmission data clock 313 may be generated by serializer 334 to operate at 1.25 GHz for timing transfers of arriving transmit data 314. In this example, reference clock 312 has a 100 pS period and each distinct bit transmitted by GRS transmitters 322 and 324 has a unit interval of 50 pS.

GRS receiver 382 receives a phase-delayed version of reference clock 312 through signal line 352 and generates a local reference clock 383, which may be coupled to GRS receiver 384 for capturing arriving pulses on signal line 354. Local reference clock 383 may also be coupled to deserializer 394 for capturing and demultiplexing data from GRS receiver 384. Extending the above example, GRS receiver 384 may capture arriving pulses on alternating clock phases of local reference clock 383, operating at 10 GHz, to generate two bits every 100 pS. Deserializer 394 is configured to demultiplex sequential data comprising two bits from GRS receiver 384 and to generate corresponding sixteen-bit words at a rate of 1.25 GHz. The sixteen-bit words are presented as receive data 374. Deserializer 394 may generate receiver data clock 373 to reflect appropriate clocking for receive data 374. Receive data 374 represents a local copy of transmit data 314. In one embodiment, deserializer 394 is configured to align arriving data along word boundaries. Persons skilled in the art will understand that serialization and deserialization of parallel data may require alignment of the parallel data along word boundaries and that well-known techniques in the art may be implemented by transceiver unit 370 or associated logic without departing the scope and spirit of embodiments of the present invention.

Serializer 396 captures arriving transmit data 376 and serializes the data for transmission by GRS transmitter 386 through signal line 356. In one embodiment, serializer 396 generates transmit data clock 375 based on local reference clock 383 as a clocking reference for arriving transmit data 376. GRS receiver 326 captures the data arriving from signal line 356 and deserializer 336 demultiplexes the data into words, presented as receive data 316. GRS transmitter 388 is configured to transmit a sequential "01" pattern to GRS receiver 328 through pads 368, signal line 358, and pads 348. In one embodiment, this "01" pattern is transmitted at substantially the same phase as data transmitted from GRS transmitter 386 to GRS receiver 326 through pads 366, signal line 356, and pads 346. GRS receiver 328 and adjustable phase delay 338 generate receive clock 318 based on the sequential "01" pattern. In one embodiment, receive data clock 315 is generated by deserializer 336 to reflect appropriate clocking for receive data 316.

Determining a proper phase delay value for adjustable phase delay 332 and adjustable phase delay 338 may be performed using any technically feasible technique. For example, phase delay values for adjustable phase delay 332 and adjustable phase delay 338 may be swept over a range of phase delay values during a link training phase, whereby phase delays corresponding to a substantially minimum bit error rate during training are determined and used for normal link operation.

Although an isochronous clocking model is illustrated herein for transmitting data between transceiver unit 310 and transceiver unit 370, any technically feasible clocking model may be implemented without departing the scope and spirit of embodiments of the present invention.

Figure 4A:
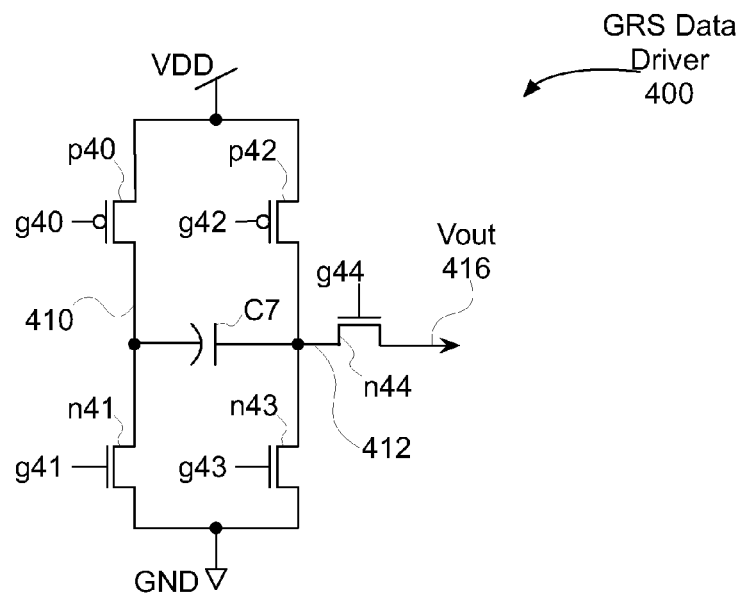
FIG. 4A illustrates a ground-referenced single-ended data driver comprising a CMOS circuit, in accordance with one embodiment.

FIG. 4A illustrates a GRS data driver 400 comprising a CMOS circuit, in accordance with one embodiment. As shown, the CMOS circuit illustrates a circuit topology that may be used to implement the data driver 162 of FIG. 1F using CMOS circuit elements. Specifically, switches S20 and S22 are implemented as p-channel FET p40, and p-channel FET p42, respectively; and switches S21, S23, and S24 are implemented as n-channel FET n41, n-channel FET n43, and n-channel FET n44, respectively. A reference node 410 is coupled to a capacitor C7, p-channel FET p40 and n-channel FET n41. An output node 412 is coupled to an opposing side of capacitor C7, as well as to p-channel FET p42, n-channel FET n43, and n-channel FET n44.

Control signal g40 is coupled to a gate node of p-channel FET p40. When control signal g40 is driven to a logical 0 level, p-channel FET p40 turns on, pulling node 410 to a voltage level associated with VDD. Control signal g41 is coupled to a gate node of n-channel FET n41. When control signal g41 is driven to a logical 1 level, n-channel FET n41 turns on, pulling node 410 to a voltage level associated with GND. Similarly, p-channel FET p42 responds to control signal g42, selectively pulling node 412 to VDD, while n-channel FET n43 responds to control signal g43, selectively pulling node 412 to GND. Control signal g44 is coupled to a gate node of n-channel FET n44. When control signal g44 is driven to a logical 0 level, n-channel FET n44 substantially isolates node 412 from node Vout 416. However, when control signal g44 is driven to a logical 1 level, n-channel FET n44 forms a low impedance path between node 412 and Vout 416. As described below in conjunction with FIG. 4D, this low impedance path facilitates driving Vout 416 with an appropriate signal.

GRS data driver 400 operates primarily in three different states, including a first pre-charge state for subsequently driving a data value of zero, a second pre-charge state for subsequently driving a data value of one, and a drive state for driving a signal line, such as signal line 105, with a signal corresponding to a preceding pre-charge state. These states are illustrated below in FIGS. 4B-4D. Transitions between pre-charge states and the drive state are orchestrated by control signals g40 through g44.

Figure 4B:
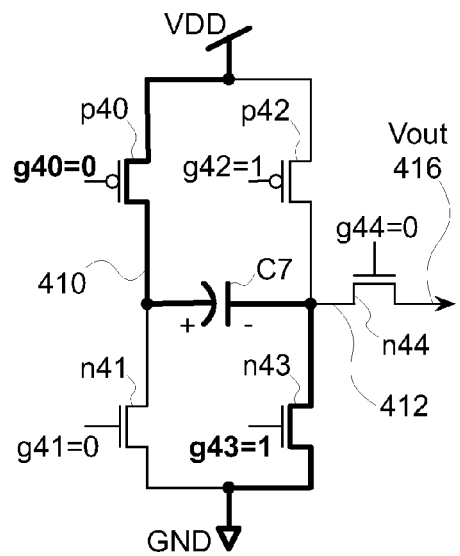
FIG. 4B illustrates a ground-referenced single-ended data driver in a pre-charge state associated with driving a data value of zero, in accordance with one embodiment.

FIG. 4B illustrates GRS data driver 400 in the first pre-charge state that is associated with driving a data value of zero, in accordance with one embodiment. As shown, in the first pre-charge state, control signal g40 is set to zero, to turn on p-channel FET p40, thereby coupling node 410 to VDD. At the same time, control signal g43 is set to one (1), to turn on n-channel FET n43, thereby coupling node 412 to GND.

Also, control signal g42 is set to one to turn off p-channel FET p42, and control signals g41 and g44 are set to zero to turn off n-channel FET n41 and n-channel FET n44, respectively. In this first pre-charge state, capacitor C7 is charged with a positive charge on node 410 and a negative charge on node 412, which is electrically isolated from node Vout 416.

Figure 4C:
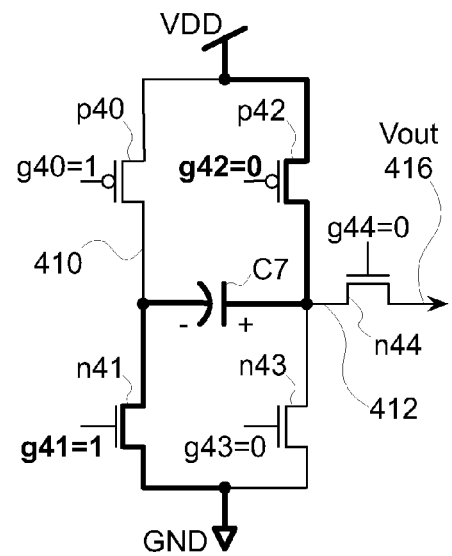
FIG. 4C illustrates a ground-referenced single-ended data driver in a pre-charge state associated with driving a data value of one, in accordance with one embodiment.

FIG. 4C illustrates GRS data driver 400 in the second pre-charge state that is associated with driving a data value of one, in accordance with one embodiment. As shown, in the second pre-charge state, control signal g42 is set to zero, to turn on p-channel FET p42, thereby coupling node 412 to VDD. At the same time, control signal g41 is set to one, to turn on n-channel FET n41, thereby coupling node 410 to GND. Also, control signal g40 is set to one to turn off p-channel FET p40, and control signals g43 and g44 are set to zero to turn off n-channel FET n43 and n-channel FET n44, respectively. In this second pre-charge state, capacitor C7 is charged with a negative charge on node 410 and a positive charge on node 412, which is electrically isolated from node Vout 416.

Figure 4D:
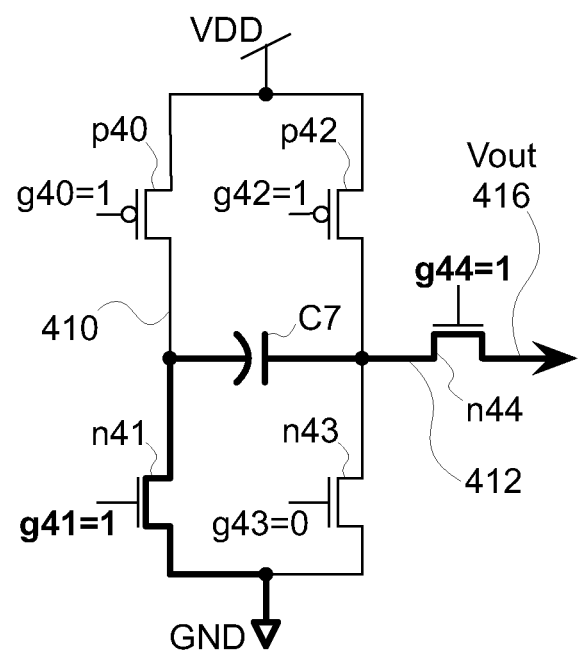
FIG. 4D illustrates a ground-referenced single-ended data driver in a drive state, in accordance with one embodiment.

FIG. 4D illustrates GRS data driver 400 in a drive state, in accordance with one embodiment. As shown, control signal g41 is set to one, coupling node 410 to GND and control signal g44 is set to one, coupling node 412 to node Vout 416. Control signals g40 and g42 are set to one, to turn off p-channel FET p40 and p-channel FET p42, respectively. Additionally, control signal g43 is set to zero, to turn off n-channel FET n43. In this state, capacitor C7 discharges into node Vout 416. If a negative charge has been accumulated in capacitor C7 in a previous pre-charge state, then C7 discharges the negative charge into node Vout 416 with respect to GND. Otherwise, if a positive charge has been accumulated in capacitor C7 in a previous pre-charge state, then C7 discharges a positive charge into node Vout 416 with respect to GND. Current passing through node Vout 416 is substantially balanced with a corresponding ground current passing through GND.

Capacitor C7 may be implemented using any technically feasible technique without departing the scope and spirit of embodiments of the present invention. In one embodiment, the capacitor C7 is implemented using n-channel FETs, in accordance with one embodiment. For example, a gate node of a first n-channel FET may be coupled to node 412 of FIG. 4A to form a back-to-back metal-oxide transistor capacitor. Additionally, source and drain nodes of the first n-channel FET may be coupled to node 410. A gate node of a second n-channel FET may be coupled to node 410, while source and drain nodes of the second n-channel FET may be coupled to node 412. Gate capacitance is relatively area-efficient compared to other capacitor structures available within a CMOS process. However, gate capacitance varies significantly with charge polarity. To compensate for polarity-dependent gate capacitance, two n-channel devices are symmetrically configured to store charge in opposite polarities. In this way, a positive pulse discharged into node Vout 416 has a substantially equal magnitude relative to a negative pulse discharged into Vout 416.

In another embodiment, the capacitor C7 may be implemented using traces in adjacent metal layers. For example, traces in sequential metal layers may be configured to provide plate capacitance (Cp) and edge capacitance (Ce) between nodes 410 and 412. Unlike gate capacitance, plate and edge capacitance between metal structures embedded within conventional dielectric materials are stable with respect to polarity. However, a capacitor formed using metal layer traces may require more die area compared to a capacitor formed using gate capacitance for an equivalent capacitance value. While two parallel traces on two adjacent layers may be used to implement the capacitor C7, one skilled in the art will understand that such a metal-oxide-metal (MOM) capacitor can be realized using more than two layers and more than two adjacent traces on each layer.

Figure 5A:
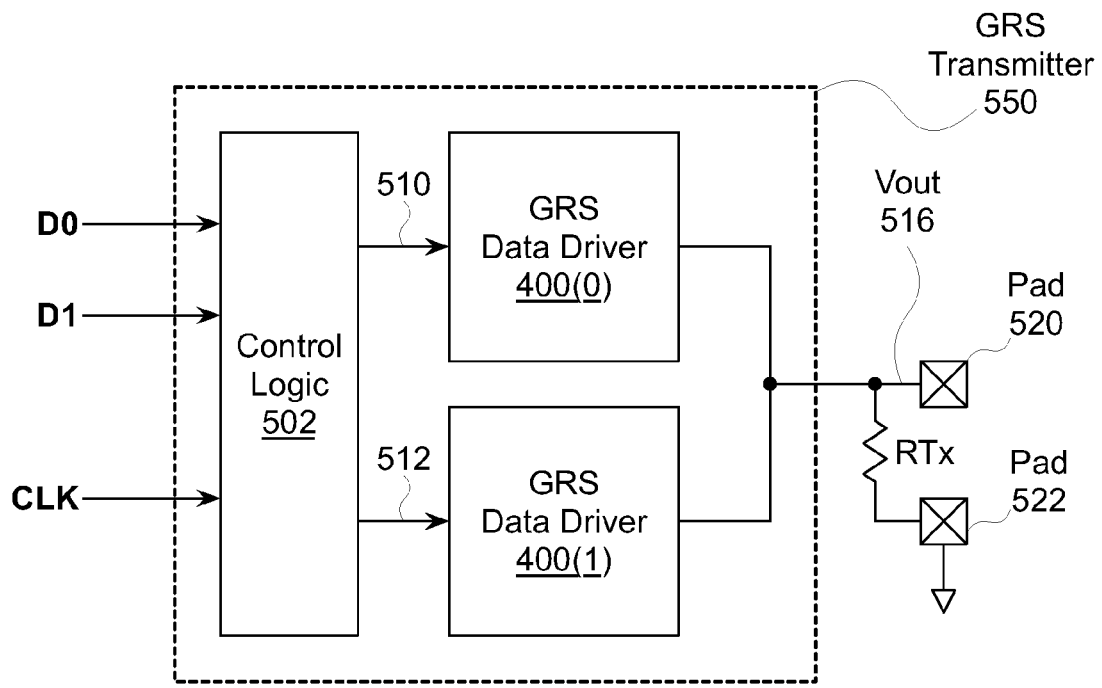
FIG. 5A illustrates a ground-referenced single-ended transmitter comprising two instances of a ground-referenced single-ended data driver, in accordance with one embodiment.

FIG. 5A illustrates a GRS transmitter 550 comprising two instances of a GRS data driver 400, in accordance with one embodiment. As shown, GRS transmitter 550 receives data input signals D0 and D1 that are synchronized to clock signal CLK. Control logic 502 receives signals D0, D1 and CLK, and, in response, generates driver control signals 510 and driver control signals 512. In one embodiment, driver control signals 510 comprise control signals g40 through g44 for instance 400(0) of GRS data driver 400, and driver control signals 512 comprise control signals g40 through g44 for instance 400(1) of GRS data driver 400.

In one embodiment, when CLK is in a logical one state, control logic 502 configures instance 400(0) to operate in a pre-charge state. If D0 is in a logical zero state, then instance 400(0) enters the pre-charge state associated with driving a data value of zero, illustrated previously in FIG. 4B. Here, driver control signals 510 are generated such that g40=0, g41=0, g42=1, g43=1, and g44=0. If, instead, D0 is in a logical one state, then instance 400(0) enters the pre-charge state associated with driving a data value of one, illustrated previously in FIG. 4C. Here, driver control signals 510 are generated such that g40=1, g41=1, g42=0, g43=0, and g44=0. When CLK is in a logical zero state, control logic 502 configures instance 400(0) to operate in the drive state, illustrated previously in FIG. 4D. Here, driver control signals 510 are generated such that g40=1, g41=1, g42=1, g43=0, and g44=1.

When CLK is in a logical zero state, control logic 502 configures instance 400(1) to operate in a pre-charge state. If D1 is in a logical zero state, then instance 400(1) enters the pre-charge state associated with driving a data value of zero, illustrated previously in FIG. 4B. Here, driver control signals 512 are generated such that g40=0, g41=0, g42=1, g43=1, and g44=0. If, instead, D1 is in a logical one state, then instance 400(1) enters the pre-charge state associated with driving a data value of one, illustrated previously in FIG. 4C. Here, driver control signals 512 are generated such that g40=1, g41=1, g42=0, g43=0, and g44=0. When CLK is in a logical one state, control logic 502 configures instance 400(1) to operate in the drive state, illustrated previously in FIG. 4D. Here, driver control signals 510 are generated such that g40=1, g41=1, g42=1, g43=0, and g44=1.

The Vout 416 signal of each instance 400(0), 400(1) is coupled to a common Vout 516 signal, which is further coupled to a pad 520. In one embodiment, Vout 516 is coupled to pad 522 via resistor RTx. Pad 522 is coupled to a circuit ground node, corresponding to GND in FIGS. 4A-4D.

In one embodiment, GRS transmitter 550 is configured to replace GRS transmitter 110 of FIG. 1A. Here, pad 520 couples Vout 516 to signal line 105 and pad 522 couples GND to ground network 107. In such a configuration, GRS receiver 130 receives data from GRS transmitter 550. In certain embodiments, GRS transmitter 550 comprises GRS Tx 322, GRS Tx 324, GRS Tx 386, and GRS Tx 388 of FIG. 3.

Figure 5B:
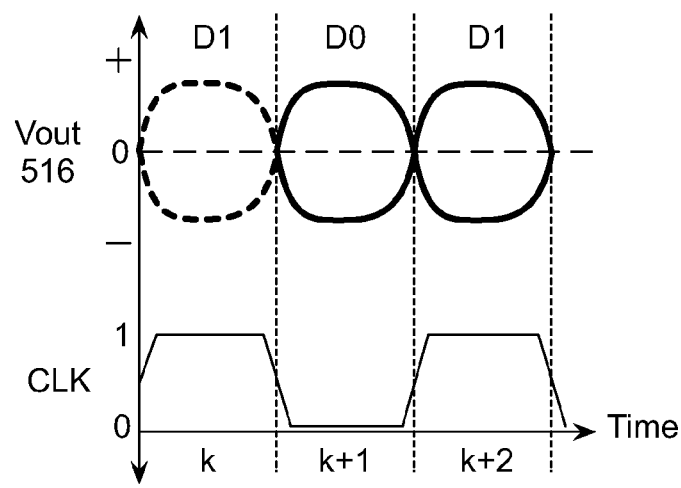
FIG. 5B illustrates timing for a ground-referenced single-ended transmitter comprising two ground-referenced single-ended data drivers, in accordance with one embodiment.

FIG. 5B illustrates timing for a GRS transmitter 550, in accordance with one embodiment. As shown, one bit of data from input D0 is transmitted to Vout 516 during time k+1 when CLK is in a logical zero state, and one bit of data from input D1 is transmitted to Vout 516 during time k+2 when CLK is in a logical one state. In one embodiment, inputs D0 and D1 are synchronous to and are updated on the rising edge of CLK. In such an embodiment, instance 400(1) is in a data driving state when inputs D0 and D1 change in response to a rising edge of CLK going into time k. On the rising edge of CLK going into time k, instance 400(0) enters a pre-charge state, thereby sampling data on D0. On the falling edge of CLK exiting time k and entering time k+1, instance 400(0) enters a data driving state and drives the captured data from D0 onto Vout 516. On the falling edge of CLK going into time k+1, instance 400(1) enters a pre-charge state, thereby sampling data on D1. On the rising edge of CLK exiting time k+1 and entering time k+2, instance 400(1) enters a data driving state and drives the captured data from D1 onto Vout 516. In this way, data comprising D0 and D1 may be presented to GRS transmitter 550 using conventional logic having conventional single-edge synchronous timing, while GRS transmitter 550 time-multiplexes the data for transmission at a double data rate. In other words, two data transfers occur in each period or cycle of the CLK. In a preferred embodiment, D0 is latched when CLK is low to ensure that D0 is stable while being used to control the pre-charge of instance 400(0). Similarly, D1 is latched when CLK is high to ensure D1 is stable while being used to control the pre-charge of instance 400(1).

In other embodiments, a GRS transmitter comprising more than two instances of GRS data driver 400 is configured to receive a data bit per instance of GRS data driver 400 and to time-multiplex the data at a correspondingly higher data rate. In such embodiments, multiple clock signals may be required to provide appropriate timing for pre-charging and driving data to time-multiplex the data.

Figure 5C:
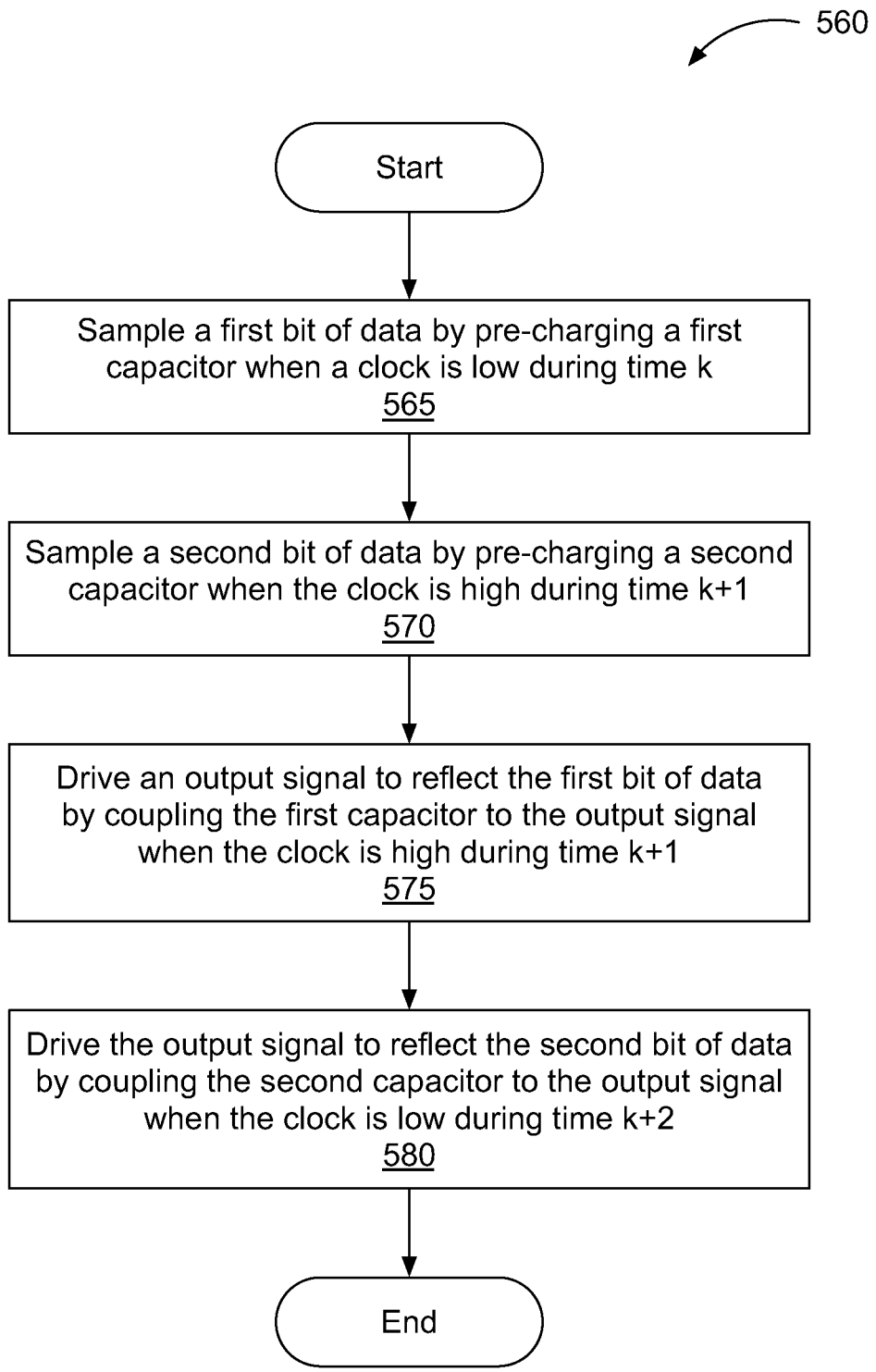
FIG. 5C illustrates a flow chart of a method for generating a ground-referenced single-ended signal, in accordance with one embodiment.

FIG. 5C illustrates a flow chart of a method 560 for generating a ground-referenced single-ended signal, in accordance with one embodiment. Although method 560 is described in conjunction with FIGS. 4A-5B to implement a two to one time-multiplexing ratio of input data to output data, persons of ordinary skill in the art will understand that any system that performs method 560 is within the scope and spirit of embodiments of the present invention.

Method 560 begins in step 565, where a first data driver, such as instance 400(0) of GRS data driver 400, samples a first bit of data by pre-charging a first capacitor during a first time k. The first capacitor is charged to have a polarity corresponding to a logic level for the first bit of data. In step 570, a second data driver, such as instance 400(1) of GRS data driver 400, samples a second bit of data by pre-charging a second capacitor during a time k+11. The second capacitor is charged to have a polarity corresponding to a logic level for the second bit of data.

In step 575, the first data driver drives an output signal, such as Vout 416 of FIGS. 4A-4D or Vout 516 of FIG. 5A, to reflect the first bit of data by coupling the first capacitor to the output signal during the time k+1. Here, the first capacitor is coupled between a ground network and the output signal. The polarity of charge on the first capacitor was established in step 565, based on the logic level for the first bit of data. When coupled to the output signal, the first capacitor therefore reflects the logic level for the first bit of data.

In step 580, the second data driver drives the output signal to reflect the second bit of data by coupling the second capacitor to the output signal during a time k+2. Here, the second capacitor is coupled between a ground network and the output signal. The polarity of charge on the second capacitor was established in step 570, based on the logic level for the second bit of data. When coupled to the output signal, the second capacitor therefore reflects the logic level for the second bit of data. Method 560 terminates after driving the output signal to reflect the second bit of data.

In other embodiments, a time-multiplexing ratio of greater than two may be implemented and at least one additional phase-related clock may be provided to orchestrate operation of more than three instances of GRS data driver 400.

Multi-Phase Ground Referenced Signaling

An alternative to time-multiplexing the outputs of two of more instances of GRS data driver 400 to increase the data rate is to transfer data over three or more phases of a clock signal. In particular, when four phases of the clock signal are used data may be transmitted at twice the rate compared with a system configured to perform 2-to-1 multiplexing. For example, when four phases are used, each of four transmitter and corresponding receiver circuits operate at ¼ the bit rate compared with ½ the bit rate for a 2-to-1 multiplexed implementation. Instead of precharging the capacitor(s) in each transmitter circuit during ½ of the clock cycle, when four phases are used of each clock cycle (three phases) is available for precharging the capacitor(s) in each transmitter circuit.

Figure 6A:
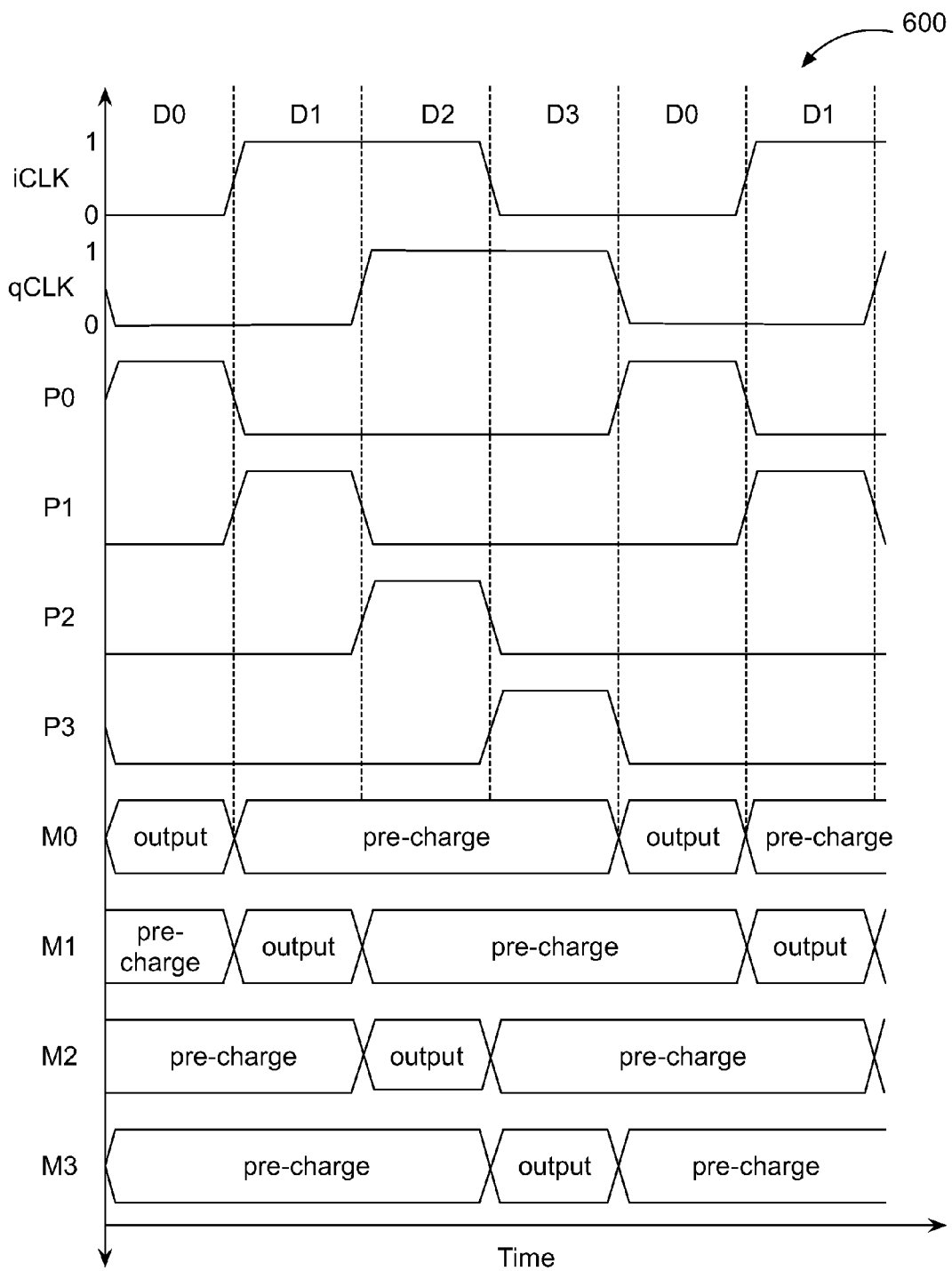
FIG. 6A illustrates timing for a multi-phase ground-referenced single-ended transmitter comprising four ground-referenced single-ended data drivers, in accordance with one embodiment.

FIG. 6A illustrates timing 600 for a multi-phase GRS transmitter comprising four GRS data drivers, in accordance with one embodiment. A clock signal represented by an in-phase clock signal iCLK and a quadrature clock signal qCLK is used to produce each of the four phases P0, P1, P2, and P3. The P0 signal corresponding to the first phase of the clock signal may be generated as the AND of inverted iCLK and inverted qCLK. The p1 signal corresponding to the second phase of the clock signal may be generated as the AND of iCLK and inverted qCLK. The P2 signal corresponding to the third phase of the clock signal may be generated as the AND of iCLK and qCLK. The P3 signal corresponding to the fourth phase of the clock signal may be generated as the AND of qCLK and inverted iCLK.

The transmitter circuits M0, M1, M2, and M3 correspond to data drivers that generate the output signals for each of the phases P0, P1, P2, and P3, respectively. As shown in the waveforms, an M0 transmitter circuit drives the output during a first phase when signal P0 is asserted. In one embodiment, a first capacitor in a first transmitter circuit M0 is discharged during the first phase to drive the output signal and the first capacitor is pre-charged during at least one phase other than the first phase (e.g., the second, third, and/or fourth phase). Similarly, a second capacitor in a second transmitter circuit M is discharged during the second phase to drive the output signal and the second capacitor is pre-charged during at least one phase other than the second phase (e.g., the first, third, and/or fourth phase). A third capacitor in a third transmitter circuit M2 is discharged during the third phase to drive the output signal and the third capacitor is pre-charged during at least one phase other than the third phase (e.g., the first, second, and/or fourth phase). A fourth capacitor in a fourth transmitter circuit M3 is discharged during the fourth phase to drive the output signal and the fourth capacitor is pre-charged during at least one phase other than the fourth phase (e.g., the first, second, and/or third phase).

Figure 6B:
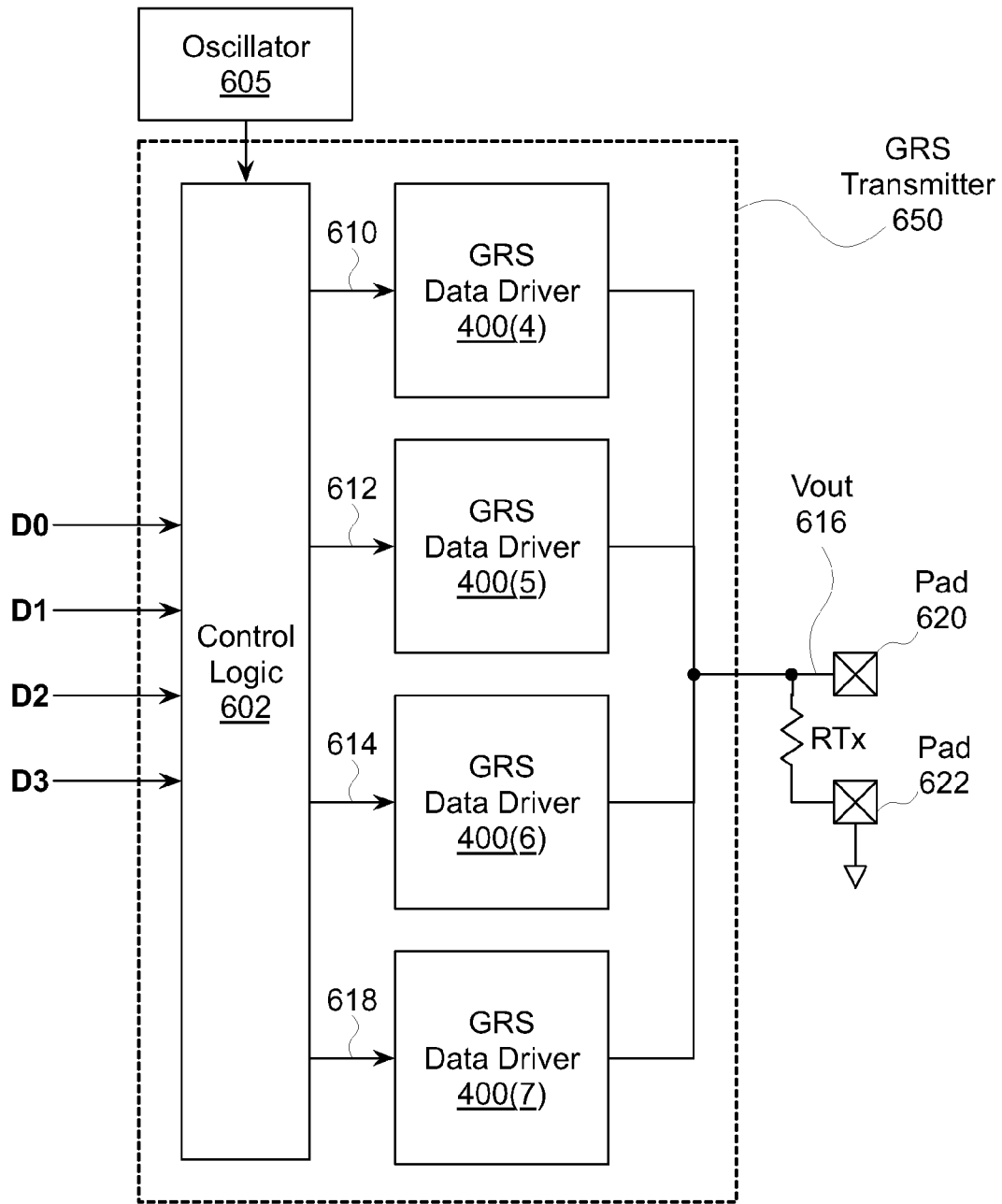
FIG. 6B illustrates a multi-phase ground-referenced single-ended transmitter comprising four instances of a ground-referenced single-ended data driver, in accordance with one embodiment.

FIG. 6B illustrates a multi-phase GRS transmitter 650 comprising four instances of a GRS data driver 400, in accordance with one embodiment. As shown, GRS transmitter 650 receives data input signals D0, D1, D2, and D3 that are synchronized to a clock signal. An oscillator 605 generates one or more signals that encode the clock signal. For example, the oscillator 605 may provide in-phase and quadrature clock signals iCLK and qCLK and inverted versions of iCLK and qCLK to control logic 602.

Control logic 602 receives the one or more signals that encode the clock signal and data input signals D0, D1, D2, and D3, and, in response, generates driver control signals 610, 612, 614, and 618. In one embodiment, driver control signals 610 comprise control signals g40 through g44 for instance 400(4) of GRS data driver 400, driver control signals 612 comprise control signals g40 through g44 for instance 400(5) of GRS data driver 400, driver control signals 614 comprise control signals g40 through g44 for instance 400(6) of GRS data driver 400, and driver control signals 618 comprise control signals g40 through g44 for instance 400(7) of GRS data driver 400.

In one embodiment, when P0 is in a logical zero state during one or more of phases P1, P2, and P3, control logic 602 configures instance 400(4) to operate in a pre-charge state. If D0 is in a logical zero state, then instance 400(4) enters the pre-charge state associated with driving a data value of zero, illustrated previously in FIG. 4B. Here, driver control signals 610 are generated such that g40=0, g41=0, g42=1, g43=1, and g44=0. If, instead, D0 is in a logical one state, then instance 400(4) enters the pre-charge state associated with driving a data value of one, illustrated previously in FIG. 4C. Here, driver control signals 610 are generated such that g40=1, g41=1, g42=0, g43=0, and g44=0. When P0 is in a logical one state, control logic 602 configures instance 400(4) to operate in the drive state, illustrated previously in FIG. 4D. Here, driver control signals 610 are generated such that g40=1, g41=1, g42=1, g43=0, and g44=1.

In one embodiment, when P1 is in a logical zero state during one or more of phases P0, P2, and P3, control logic 602 configures instance 400(5) to operate in a pre-charge state. If D1 is in a logical zero state, then instance 400(5) enters the pre-charge state associated with driving a data value of zero, illustrated previously in FIG. 4B. Here, driver control signals 612 are generated such that g40=0, g41=0, g42=1, g43=1, and g44=0. If, instead, D1 is in a logical one state, then instance 400(5) enters the pre-charge state associated with driving a data value of one, illustrated previously in FIG. 4C. Here, driver control signals 612 are generated such that g40=1, g41=1, g42=0, g43=0, and g44=0. When P1 is in a logical one state, control logic 602 configures instance 400(5) to operate in the drive state, illustrated previously in FIG. 4D. Here, driver control signals 612 are generated such that g40=1, g41=1, g42=1, g43=0, and g44=1.

In one embodiment, when P2 is in a logical zero state during one or more of phases P0, P1, and P3, control logic 602 configures instance 400(6) to operate in a pre-charge state. If D0 is in a logical zero state, then instance 400(6) enters the pre-charge state associated with driving a data value of zero, illustrated previously in FIG. 4B. Here, driver control signals 614 are generated such that g40=0, g41=0, g42=1, g43=1, and g44=0. If, instead, D2 is in a logical one state, then instance 400(6) enters the pre-charge state associated with driving a data value of one, illustrated previously in FIG. 4C. Here, driver control signals 614 are generated such that g40=1, g41=1, g42=0, g43=0, and g44=0. When P2 is in a logical one state, control logic 602 configures instance 400(6) to operate in the drive state, illustrated previously in FIG. 4D. Here, driver control signals 614 are generated such that g40=1, g41=1, g42=1, g43=0, and g44=1.

In one embodiment, when P3 is in a logical zero state during one or more of phases P0, P1, and P2, control logic 602 configures instance 400(7) to operate in a pre-charge state. If D3 is in a logical zero state, then instance 400(7) enters the pre-charge state associated with driving a data value of zero, illustrated previously in FIG. 4B. Here, driver control signals 618 are generated such that g40=0, g41=0, g42=1, g43=1, and g44=0. If, instead, D3 is in a logical one state, then instance 400(7) enters the pre-charge state associated with driving a data value of one, illustrated previously in FIG. 4C. Here, driver control signals 618 are generated such that g40=1, g41=1, g42=0, g43=0, and g44=0. When P3 is in a logical one state, control logic 602 configures instance 400(7) to operate in the drive state, illustrated previously in FIG. 4D. Here, driver control signals 618 are generated such that g40=1, g41=1, g42=1, g43=0, and g44=1.

The Vout 416 signal of each instance 400(4), 400(5), 400(6), 400(7) is coupled to a common Vout 616 signal, which is further coupled to a pad 620. In one embodiment, Vout 616 is coupled to pad 622 via resistor RTx. Pads 622 are coupled to a circuit ground node, corresponding to GND in FIGS. 4A-4D.

In one embodiment, GRS transmitter 650 is configured to replace GRS transmitter 110 of FIG. 1A. Here, pad 620 couples Vout 616 to signal line 105 and pad 622 couples GND to ground network 107. In such a configuration. GRS receiver 130 receives data from GRS transmitter 650. In certain embodiments, GRS transmitter 650 comprises GRS Tx 322, GRS Tx 324, GRS Tx 386, and GRS Tx 388 of FIG. 3.

In one embodiment, each instance 400(4), 400(5), 400(6), 400(7) is replaced with an instance of data driver 112 of FIGS. 1A and 1B, data driver 152 of FIGS. 1C, 1D, and 1E, or data driver 172 of FIG. 1G. When data driver 112 is used, driver control signals 610, 612, 614, and 618 comprise control signals S01 through S06 for each instance GRS data driver 112. For the GRS data driver 112 corresponding to the first phase, when P0 is in a logical zero state during one or more of phases P1, P2, and P3, control logic 602 configures the GRS data driver 112 corresponding to the first phase to operate in a pre-charge state, illustrated previously in FIG. 1B. Here, driver control signals 610 are generated such that S01=1, S02=1, and S03-S06=0. For the GRS data driver 112 corresponding to the first phase, when P0 is in a logical one state, control logic 602 configures the GRS data driver 112 corresponding to the first phase to operate in a drive state, illustrated previously in FIG. 1B. If D0 is in a logical zero state, then the GRS data driver 112 corresponding to the first phase enters the drive state associated with driving a data value of zero. Here, driver control signals 610 are generated such that S01-S02=0, S03=1, S04=0, S05=1, and S06=0. If, instead, D0 is in a logical one state, then the GRS data driver 112 corresponding to the first phase enters the drive state associated with driving a data value of one. Here, driver control signals 610 are generated such that S01=S02=0, S03=0, S04=1, S05=0, and S06=1. The data drivers 112 corresponding to phases P1, P2, and P3 are controlled by the driver control signals 612, 614, and 618 in a respective manner.

When data driver 152 is used in the GRS transmitter 650, driver control signals 610, 612, 614, and 618 comprise control signals S0A through S0H for each instance GRS data driver 152. For the GRS data driver 152 corresponding to the first phase, when P0 is in a logical zero state during one or more of phases P1, P2, and P3, control logic 602 configures the GRS data driver 152 corresponding to the first phase to operate in a pre-charge state, illustrated previously in FIG. 1D. Here, driver control signals 610 are generated such that S0A=1, S0B=0, S0C=0, S0D=1, S0E=0, S0F=0, S0G=1, and S0H=1. For the GRS data driver 152 corresponding to the first phase, when P0 is in a logical one state, control logic 602 configures the GRS data driver 152 corresponding to the first phase to operate in a drive state, illustrated previously in FIG. 1E. If D0 is in a logical zero state, then the GRS data driver 152 corresponding to the first phase enters the drive state associated with driving a data value of zero. Here, driver control signals 610 are generated such that S0A=0, S0B=1, S0C=1, S0D=0, and S0E-H=0. If, instead, D0 is in a logical one state, then the GRS data driver 152 corresponding to the first phase enters the drive state associated with driving a data value of one.

Here, driver control signals 610 are generated such that S0A-S0D=0, S0E=1, S0F=1, S0G=0, and S0H=0. The data drivers 152 corresponding to phases P1, P2, and P3 are controlled by the driver control signals 612, 614, and 618 in a respective manner.

When data driver 172, illustrated in FIG. 1G, is used in the GRS transmitter 650, driver control signals 610, 612, 614, and 618 comprise control signals S30 through S33 and S40 through S42 for each instance GRS data driver 172. For the GRS data driver 172 corresponding to the first phase, when P0 is in a logical zero state during one or more of phases P1, P2, and P3, control logic 602 configures the GRS data driver 172 corresponding to the first phase to operate in a pre-charge state. Here, driver control signals 610 are generated such that S30=1, S31=0, S32=0, S33=1, S40=1, S41=1, and S42=0. For the GRS data driver 172 corresponding to the first phase, when P0 is in a logical one state, control logic 602 configures the GRS data driver 172 corresponding to the first phase to operate in a drive state. If D0 is in a logical zero state, then the GRS data driver 172 corresponding to the first phase enters the drive state associated with driving a data value of zero. Here, driver control signals 610 are generated such that S30=0, S31=1, S32=1, S33=0, S40=0, S41=0, and S42=0. If, instead, D0 is in a logical one state, then the GRS data driver 172 corresponding to the first phase enters the drive state associated with driving a data value of one. Here, driver control signals 610 are generated such that S30=0, S31=0, S32=0, S33=0, S40=0, S41=1, and S42=1. The data drivers 172 corresponding to phases P1, P2, and P3 are controlled by the driver control signals 612, 614, and 618 in a respective manner.

Figure 6C:
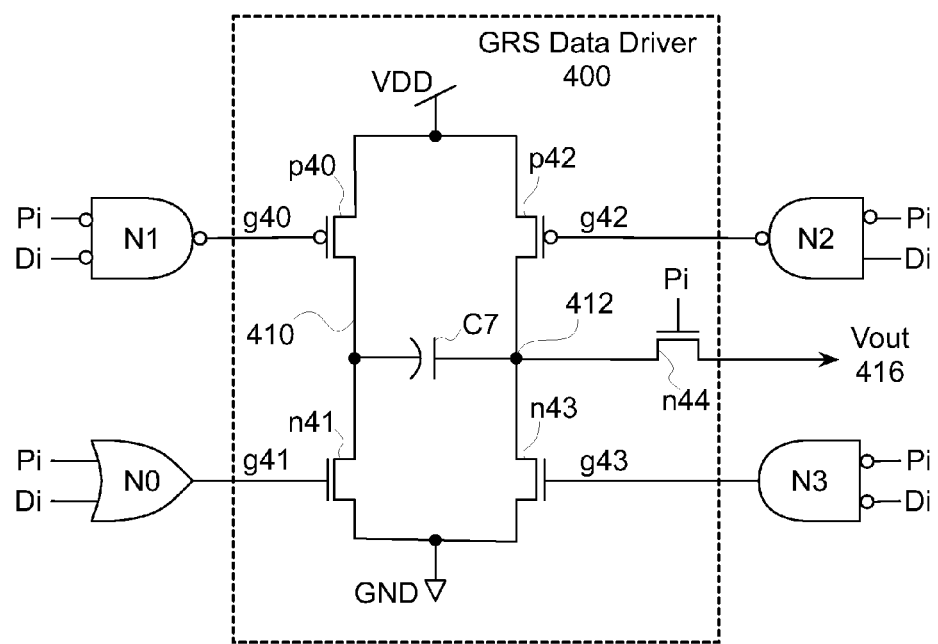
FIG. 6C illustrates an instance of a GRS data driver from FIG. 6B corresponding to one phase of the clock signal, in accordance with one embodiment.

FIG. 6C illustrates an instance of a GRS data driver 400 from FIG. 6B corresponding to one phase of the clock signal, in accordance with one embodiment. As previously explained in conjunction with FIGS. 4A-4D, the capacitor C7 is pre-charged with a positive or negative voltage depending on the input data and the capacitor C7 is discharged in the same direction. The input data Di (e.g., D0, D1, D2, and D3) is captured during the phase Pi (e.g., P0, P1, P2, and P3) so that the data input is held steady during the pre-charge state. Logic gates N0, N1, N2, and N3 are configured to pre-charge the capacitor C7 and the logic gate N0 is configured to discharge the capacitor C7 in a drive state to drive Vout 416. More specifically, the capacitor C7 is pre-charged in the positive direction when Di is a logical one and the p-channel FET p42 and the n-channel FET n41 are both turned on, as illustrated in FIG. 4C. The capacitor C7 is pre-charge in the negative direction with Di is a logical zero and the p-channel FET p40 and the n-channel FET n43 are both turned on, as illustrated in FIG. 4B. When Pi is a logical one, the n-channel FET n41 and the n-channel FET n44 are both turned on to discharge the capacitor C7 between Vout 416 and ground, as illustrated in FIG. 4D.

Figure 6D:
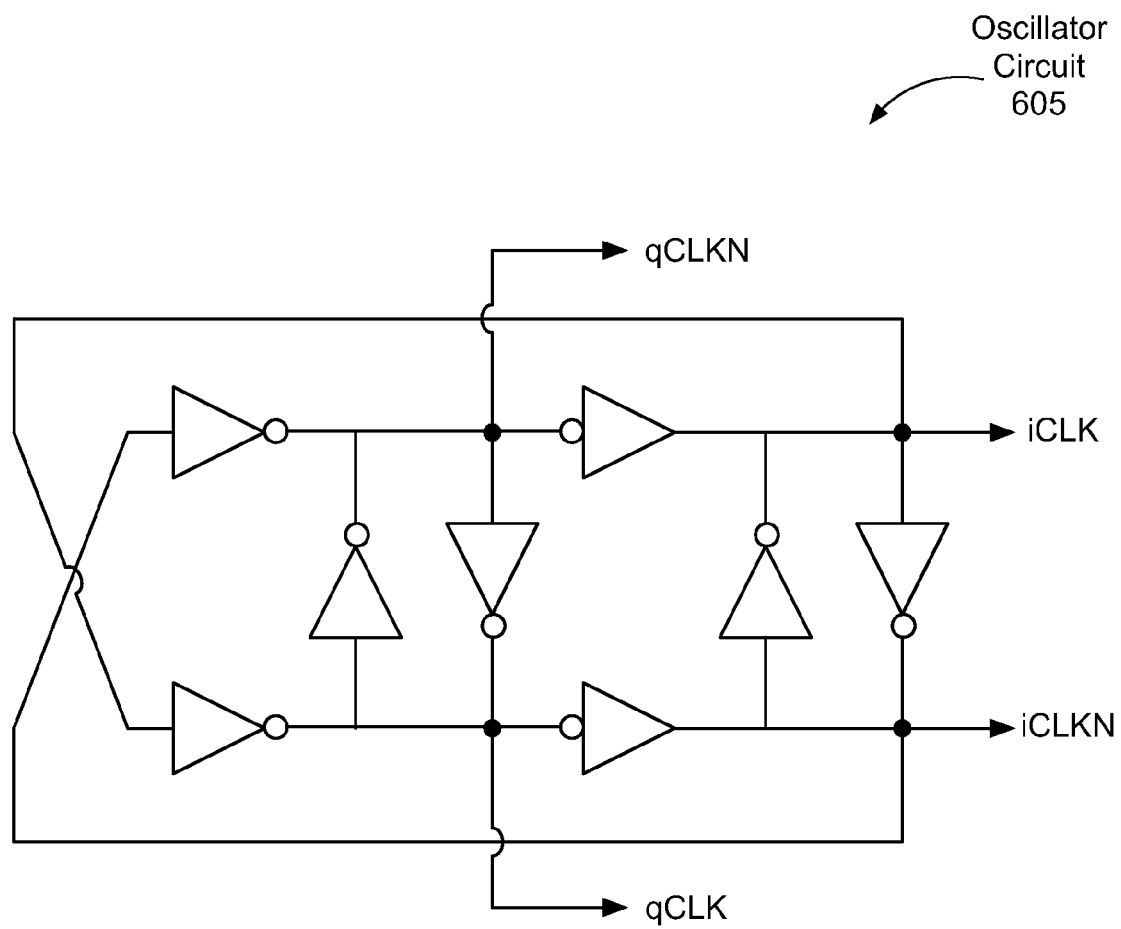
FIG. 6D illustrates a four phase ring oscillator circuit, in accordance with one embodiment.

FIG. 6D illustrates a four-phase ring oscillator circuit 605, in accordance with one embodiment. The four-phase ring oscillator circuit 605 may be used to generate the signals that encode the clock signals, iCLK and qCLK, as well as the inverted clock signals, iCLKN and qCLKN, respectively.

Cross-coupling of the inverters shown in FIG. 6D may be implemented to exclude the stable states of the dynamic circuit and ensure that the circuit will oscillate. In one embodiment, the oscillator circuit 605 is operated as a voltage-controlled oscillator (VCO) of a phase-locked loop (PLL) by modulating the power supply of the oscillator circuit 605. Also, in one embodiment, the oscillator circuit 605 may be followed by a duty-factor correction circuit configured to adjust each output, so that both iCLK and qCLK have a 50% duty factor. In one embodiment, the oscillator circuit 605 is followed by a phase correction circuit that adjusts the phase of the qCLK output, so that times during which P1 and P2 are logical ones have substantially identical durations and the times during which P0 and P3 are logical ones have substantially identical durations.

The two signals iCLK and qCLK that encode the clock signal may be forwarded to the destination to reduce the effects of fixed-pattern jitter. At a receiver, the forwarded clock signals may be used to sample the received data signals using an integrating or a point-sampling receiver, as described in further detail in conjunction with FIGS. 8A, 8B, and 8C. In one embodiment, the iCLK signal may be transmitted with the data by configuring a multi-phase GRS transmitter 650 with the data inputs set at D3=0, D2=1, D1=1, and D0=0. In one embodiment, the qCLK signal may be transmitted with the data by configuring a multi-phase GRS transmitter 650 with the data inputs set at D3=0, D2=0, D1=1, and D0=1. In one embodiment, a phase rotator circuit is inserted into the clock path from the oscillator 605 to the multi-phase GRS transmitters 650 and/or the two multi-phase GRS transmitters 650 that are configured to generate the forwarded clock signals to enable adjustment of the relative phase between the data and the forwarded clock signals iCLK and qCLK.

Figure 7A:
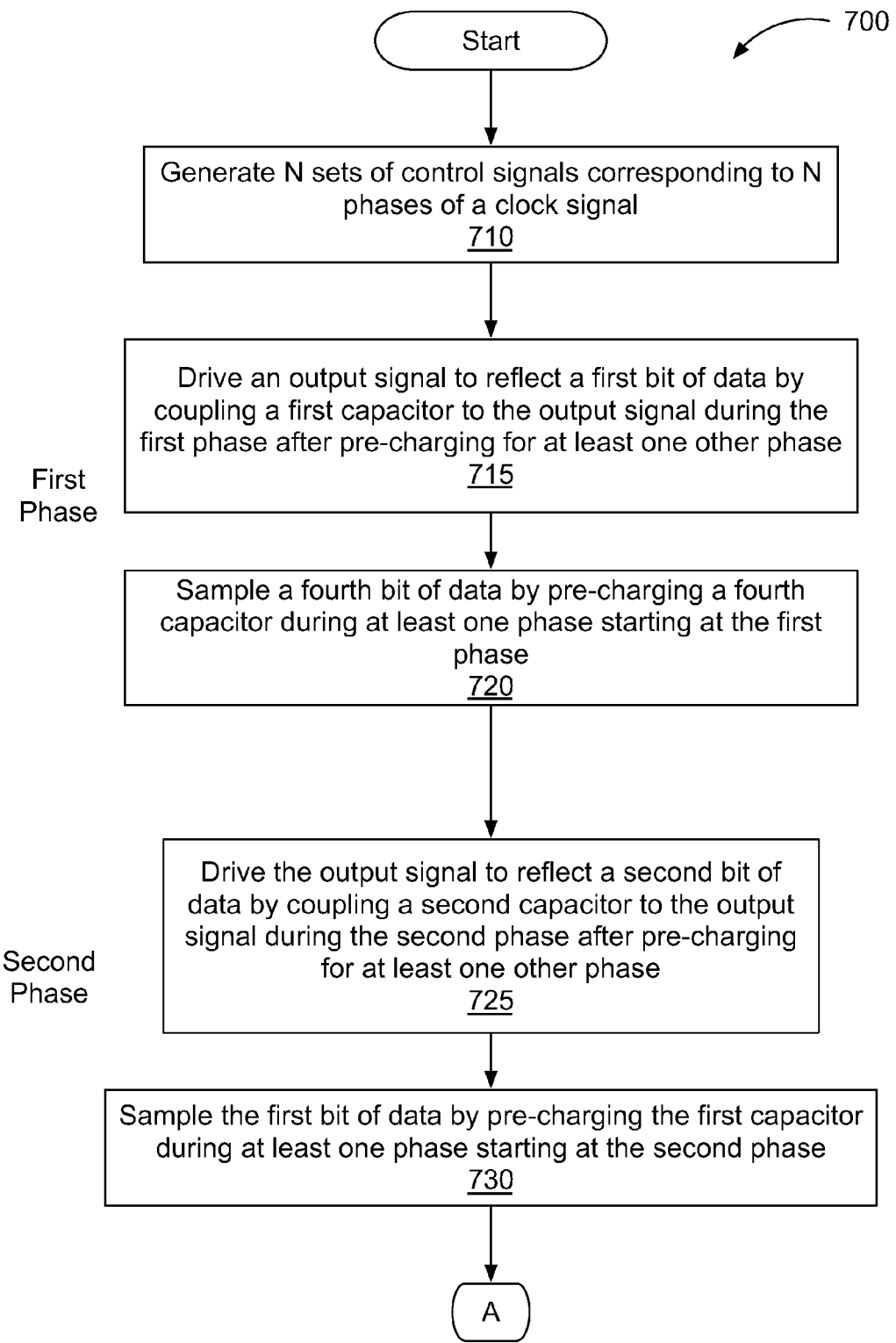
FIGS. 7A & 7B illustrate a flow chart of a method for generating a multi-phase ground-referenced single-ended signal, in accordance with one embodiment.
Figure 7B:
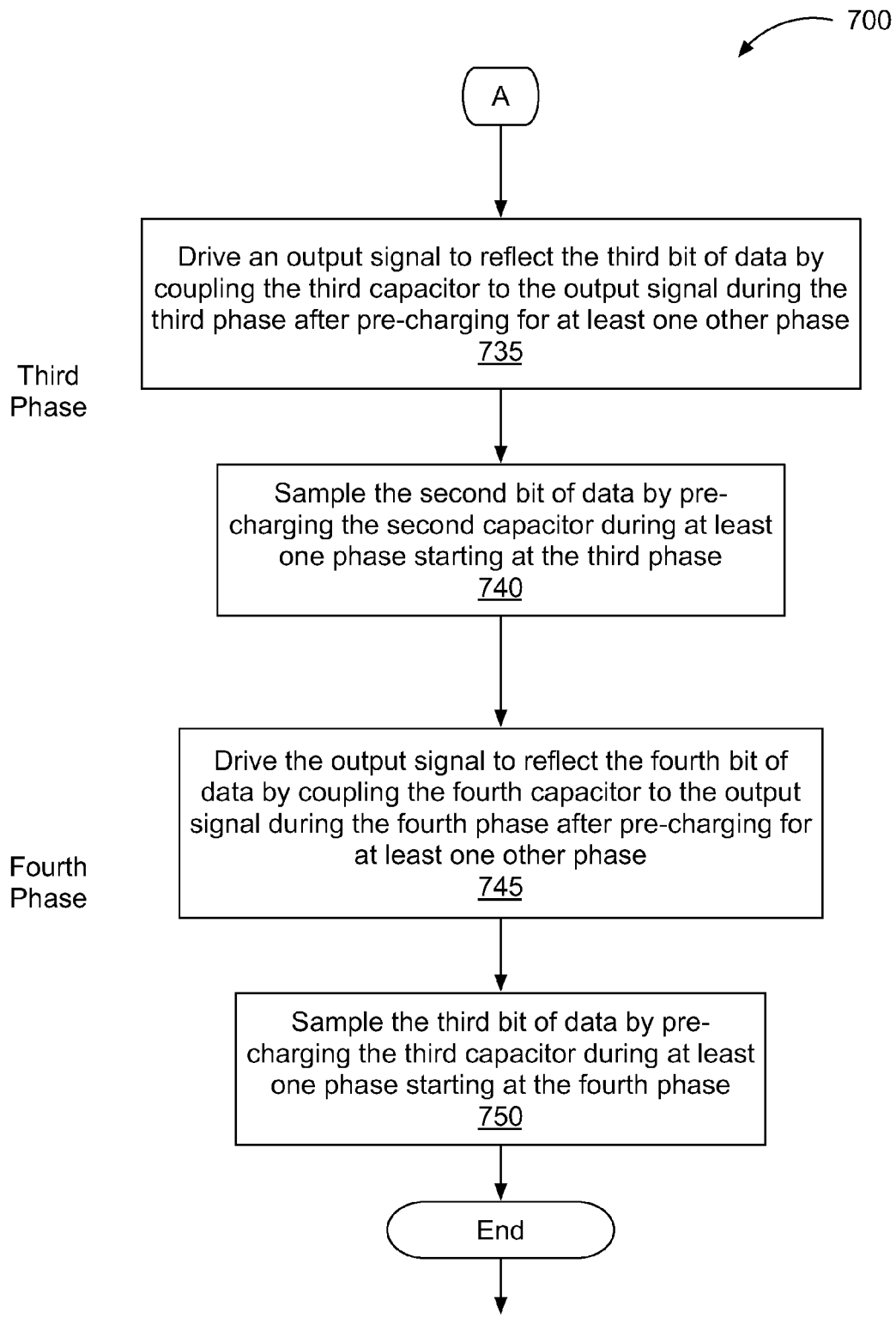

FIGS. 7A & 7B illustrate a flow chart of a method 700 for generating a multi-phase GRS signal, in accordance with one embodiment. Although method 700 is described in conjunction with FIGS. 6A-6D to implement an N-phase transmitter, where N=4, persons of ordinary skill in the art will understand that any system that performs method 700 is within the scope and spirit of embodiments of the present invention. In particular, the method 700 may be extended to perform multi-phase signaling for three phases, as described in conjunction with FIGS. 9A and 9B, or for more than four phases.

Method 700 begins in step 710, where a controller, such as control logic 602 of GRS transmitter 650, generates N sets of control signals, where each set of control signals corresponds to one of N phases of a clock signal. A first set of control signals 610 is generated based on a first phase of a clock signal, P0. The controller generates a second set of control signals 612 based on a second phase of the clock signal, P1. The controller generates a third set of control signals 614 based on a third phase of the clock signal, P2. The controller generates a fourth set of control signals 618 based on a fourth phase of the clock signal, P3.

In one embodiment, the first set of control signals 610 is generated based on a first input data signal D0 and a first clock phase signal P0, the second set of control signals 612 is based on a second input data signal D1 and a second clock phase signal P1, the third set of control signals 614 based on a third input data signal D2 and a third clock phase signal P2, and the fourth set of control signals 618 based on a fourth input data signal D3 and a fourth clock phase signal P3.

In step 715, a first data driver, such as instance 400(4) of GRS data driver 400 within the GRS transmitter 650, drives an output signal relative to a ground network based on a first charge during a first phase of the clock signal, where the output signal is a GRS signal. The first charge is stored by pre-charging a first capacitor in the first data driver based on the first set of control signals during at least one phase of the clock signal other than the first phase of the clock signal. In one embodiment, the first capacitor is coupled between a first output node and a first reference node. As shown in FIG. 6A, during the first phase, when P0 is a logical one, M0, which corresponds to instance 400(4), is driving the output signal.

In step 720, a fourth data driver, such as instance 400(7) of GRS data driver 400 within the GRS transmitter 650 samples a fourth bit of data by pre-charging a fourth capacitor during at least one phase starting at the first phase. As shown in FIG. 6A, when P0 is a logical one, M3, which corresponds to instance 400(7) is in the pre-charge state.

In step 725, a second data driver, such as instance 400(5) of GRS data driver 400 within the GRS transmitter 650, drives the output signal relative to the ground network based on a second charge during a second phase of the clock signal. The second charge is stored by pre-charging a second capacitor in the second data driver based on the second set of control signals during at least one phase of the clock signal other than the second phase of the clock signal. As shown in FIG. 6A, during the second phase, when P1 is a logical one, M1, which corresponds to instance 400(5) is driving the output signal.

In step 730, the first data driver samples the first bit of data by pre-charging the first capacitor during at least one phase starting at the second phase. As shown in FIG. 6A, during the second phase, when P1 is a logical one, M0, which corresponds to instance 400(4), is in the pre-charge state.

In step 735, a third data driver, such as instance 400(6) of GRS data driver 400 within the GRS transmitter 650, drives the output signal relative to the ground network based on a third charge during a third phase of the clock signal. The third charge is stored by pre-charging a third capacitor in the third data driver based on the third set of control signals during at least one phase of the clock signal other than the third phase of the clock signal. As shown in FIG. 6A, during the third phase, when P2 is a logical one, M2, which corresponds to instance 400(6), is driving the output signal.

In step 740, the second data driver samples the second bit of data by pre-charging the second capacitor during at least one phase starting at the third phase. As shown in FIG. 6A, during the third phase, when P2 is a logical one, M1, which corresponds to instance 400(5), is in the pre-charge state.

In step 745, the fourth data driver drives the output signal relative to the ground network based on a fourth charge during a fourth phase of the clock signal. The fourth charge is stored by pre-charging a fourth capacitor in the fourth data driver based on the fourth set of control signals during at least one phase of the clock signal other than the fourth phase of the clock signal. As shown in FIG. 6A, during the fourth phase, when P3 is a logical one, M3, which corresponds to instance 400(7), is driving the output signal.

In step 750, the third data driver samples the third bit of data by pre-charging the third capacitor during at least one phase starting at the fourth phase. As shown in FIG. 6A, during the fourth phase, when P3 is a logical one, M2, which corresponds to instance 400(6), is in the pre-charge state.

Figure 8A:
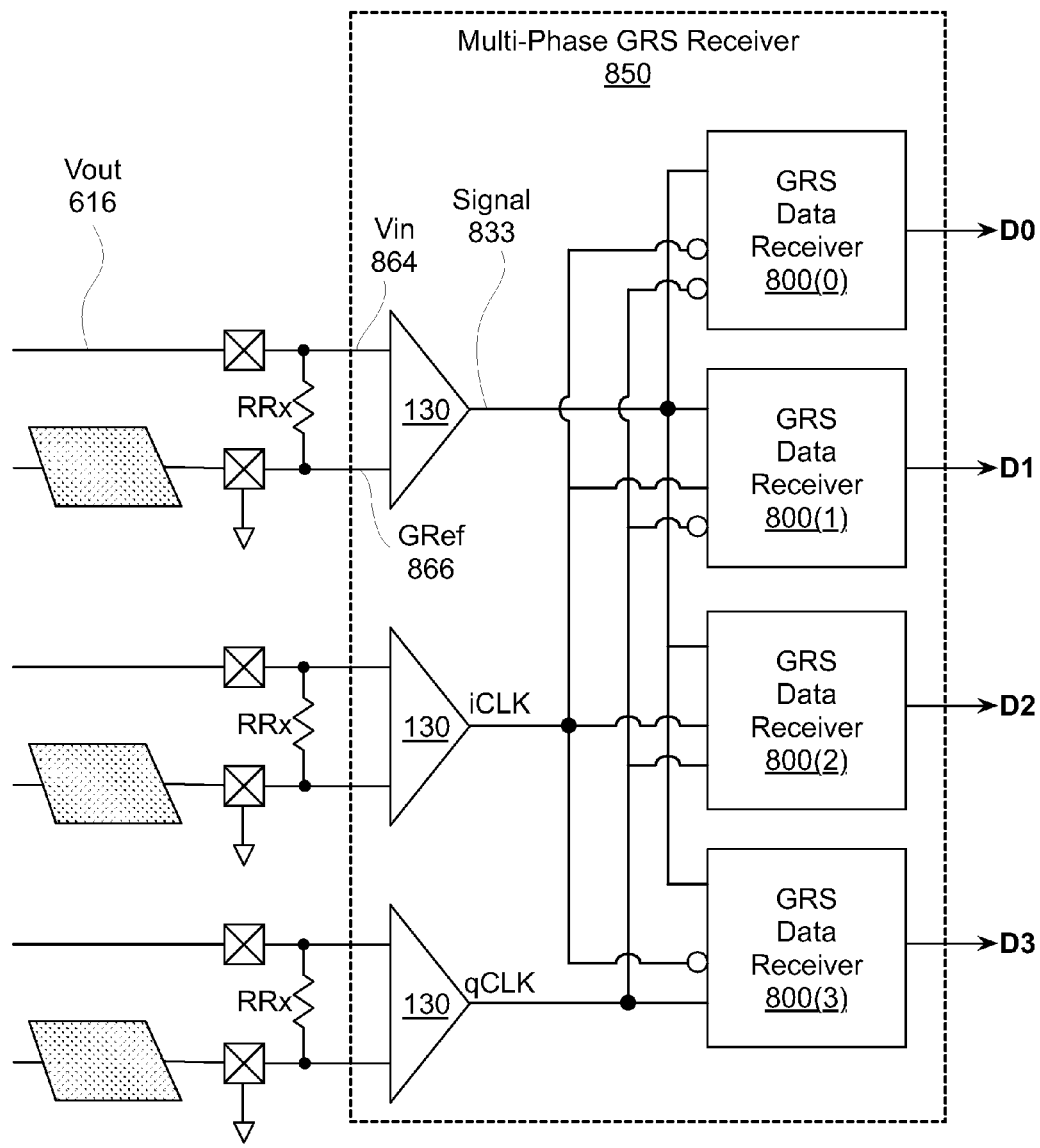
FIG. 8A illustrates a multi-phase ground-referenced single-ended receiver comprising four instances of a ground-referenced single-ended data receiver, in accordance with one embodiment.

FIG. 8A illustrates a multi-phase GRS receiver 850 comprising four instances of a GRS data receiver 800, in accordance with one embodiment. A four-phase GRS signal 833 is separated into four bits of data, D0, D1, D2, and D3 by the four GRS data receivers 800(0)-800(3) using iCLK and qCLK. The clock signals may be transmitted with Vout 616 and used to capture and store the logic state of the signal 833 that is generated by a GRS receiver 130 (illustrated in FIG. 2A) on the different clock phases P0, P1, P2, and P3 to demultiplex input data represented as arriving pulses on input signal Vin 864, referenced to input signal GRef 866. Each output signal D0, D1, D2, and D3 generated by the GRS data receivers 800 is captured input data for one of the four phases.

In one embodiment, the GRS data receivers 800 comprise a negative edge triggered flip-flop. As shown, a negative edge triggered flip-flop is configured to capture the signal 833 during the falling edge of a signal that is the AND of iCLKN and qCLKN to generate D0, where iCLKN is the inverted iCLK and qCLKN is the inverted qCLK. In alternative embodiments, the signal 833 is captured on a rising edge of the signal that is the AND of iCLKN and qCLKN to generate D0. In other alternative embodiments, the storage elements comprise level-sensitive latches rather than flip-flops. As shown, a negative edge triggered flip-flop within the GRS data receiver 800(1) is configured to capture the signal 833 during the falling edge of a signal that is the AND of iCLK and qCLKN to generate D1. A negative edge triggered flip-flop within the GRS data receiver 800(2) is configured to capture the signal 833 during the falling edge of a signal that is the AND of iCLK and qCLK to generate D2. A negative edge triggered flip-flop within the GRS data receiver 800(3) is configured to capture the signal 833 during the falling edge of a signal that is the AND of iCLKN and qCLK to generate D3.

In one embodiment, the GRS data receivers 800 are integrating receivers that integrate the signal 833 during a respective one of the phases to produce a characterized output signal that is sensed during a subsequent phase. The sensing circuitry is then pre-charged during one or more remaining phases. For example, the GRS data receiver 800(0) may be configured to integrate the signal 833 during the first phase P0 to produce a first characterized output signal, sense the first characterized output signal during the second phase P1, and pre-charge the sensing circuitry during the third and/or fourth phases P3 and/or P4.

In another embodiment, the GRS data receivers 800 are sampling receivers that sample the signal 833 at a particular time during a respective one of the phases to produce the output signals. The particular time at which the signal 833 is sampled may be determined by interpolating between the rising and falling edges that define a phase. The sampling logic may be pre-charged during one or more remaining phases when the signal 833 is not being sampled. For example, the GRS data receiver 800(0) may be configured to interpolate between the rising and falling edges of the signal produced as the AND of iCLKN and qCLKN that define the first phase P0 to determine a particular sampling time for subsequent first phases.

Figure 8B:
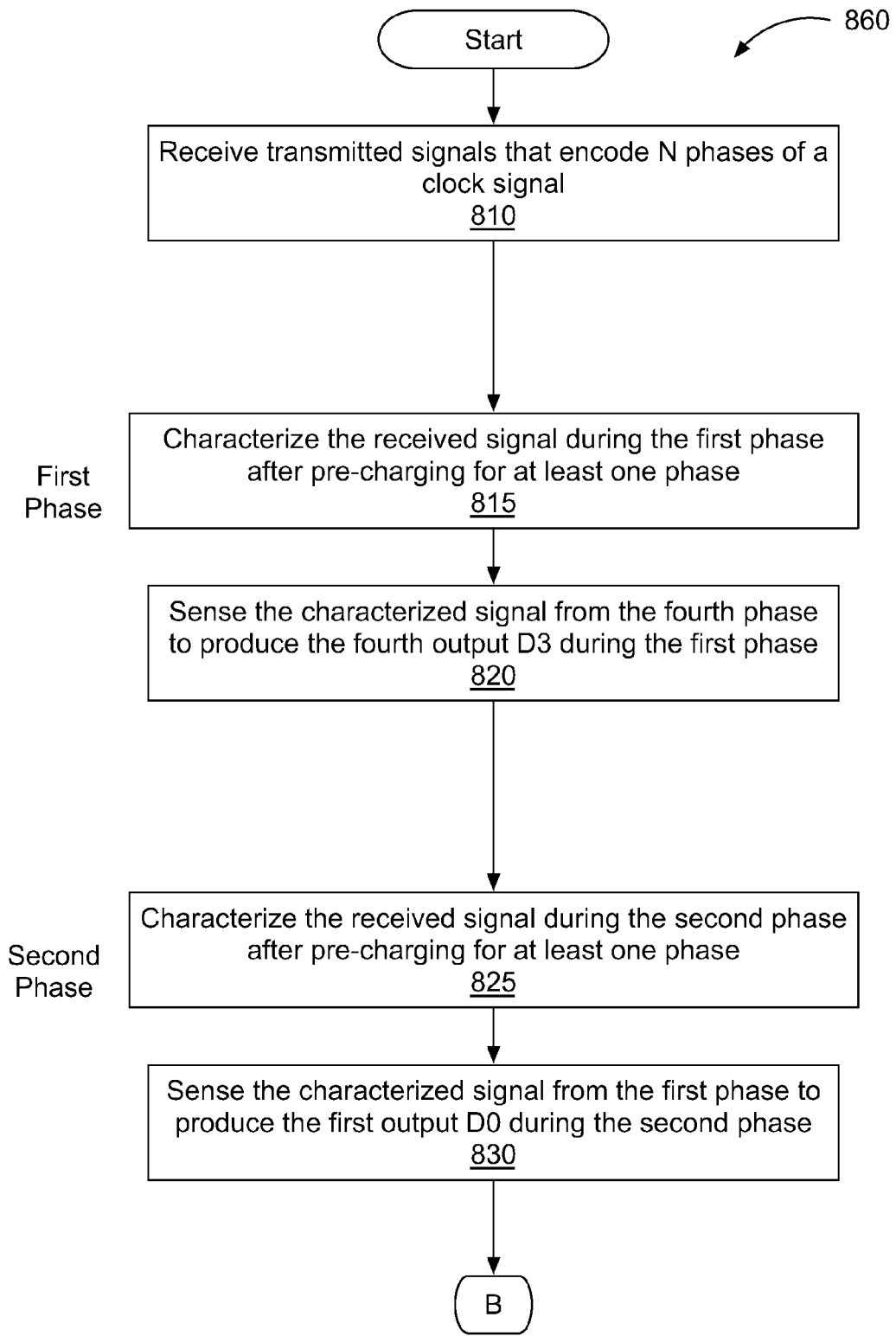
FIGS. 8B & 8C illustrate a flow chart of a method for receiving a multi-phase ground-referenced single-ended signal, in accordance with one embodiment.
Figure 8C:
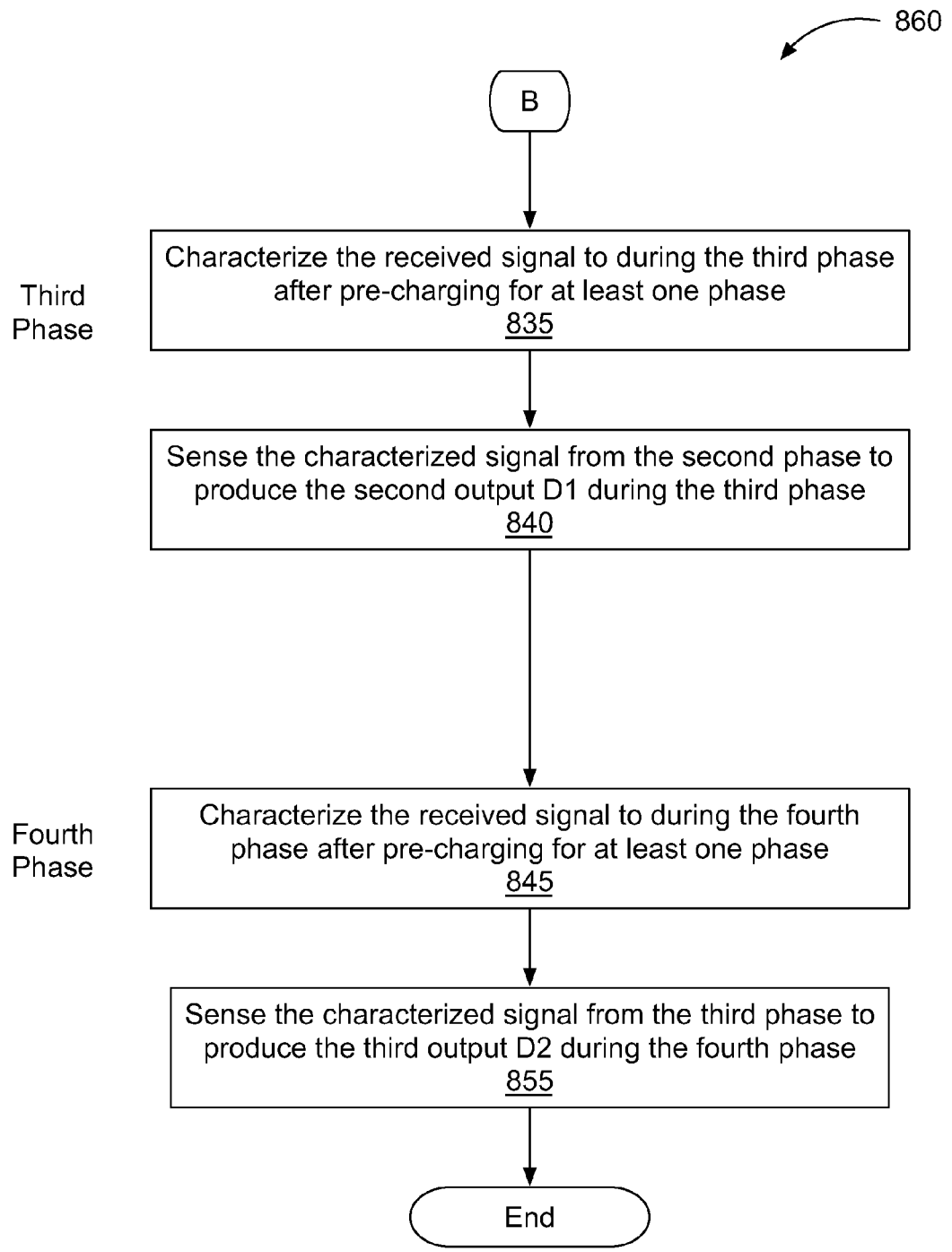

FIGS. 8B & 8C illustrate a flow chart of a method 860 for receiving a multi-phase GRS signal, in accordance with one embodiment. Although method 860 is described in conjunction with FIG. 8A to implement an N-phase receiver, where N=4, persons of ordinary skill in the art will understand that any system that performs method 860 is within the scope and spirit of embodiments of the present invention. In particular, the method 860 may be extended to receive multi-phase signals for three phases or for more than four phases.

Method 860 begins in step 810, where transmitted signals that encode N phases of a clock signal are received. For example, as shown in FIG. 8A, signals iCLK and qCLK encode in-phase and quadrature clock signals and four separate signals that each correspond to a different phase P0, P1, P2, and P3 may be decoded using iCLK and qCLK.

In step 815, a first GRS data receiver, such as instance 800(0) of the GRS data receiver 800 within the multi-phase GRS receiver 850, receives a GRS output signal 833 and characterizes the received GRS output signal 833 during a first phase of the clock signal after pre-charging sensing circuitry in the first GRS data receiver during at least one phase of the clock signal other than the first phase of the clock signal. In step 820, during the first phase, a characterized signal corresponding to the fourth phase is sensed by sensing circuitry within a fourth GRS data receiver to produce the fourth output, D3.

In step 825, a second GRS data receiver, such as instance 800(1) of the GRS data receiver 800 within the multi-phase GRS receiver 850, receives the GRS output signal 833 and characterizes the received GRS output signal 833 during a second phase of the clock signal after pre-charging sensing circuitry in the second GRS data receiver during at least one phase of the clock signal other than the second phase of the clock signal. In step 830, during the second phase, the characterized signal corresponding to the first phase is sensed by sensing circuitry within the first GRS data receiver to produce the first output, D0.

In step 835, a third GRS data receiver, such as instance 800(2) of the GRS data receiver 800 within the multi-phase GRS receiver 850, receives the GRS output signal 833 and characterizes the received GRS output signal 833 during a third phase of the clock signal after pre-charging sensing circuitry in the third GRS data receiver during at least one phase of the clock signal other than the third phase of the clock signal. In step 840, during the third phase, the characterized signal corresponding to the second phase is sensed by sensing circuitry within the second GRS data receiver to produce the second output, D1.

In step 845, the fourth GRS data receiver, such as instance 800(3) of the GRS data receiver 800 within the multi-phase GRS receiver 850, receives the GRS output signal 833 and characterizes the received GRS output signal 833 during the fourth phase of the clock signal after pre-charging sensing circuitry in the fourth GRS data receiver during at least one phase of the clock signal other than the fourth phase of the clock signal. In step 850, during the fourth phase, the characterized signal corresponding to the third phase is sensed by sensing circuitry within the third GRS data receiver to produce the third output, D2.

Figure 9A:
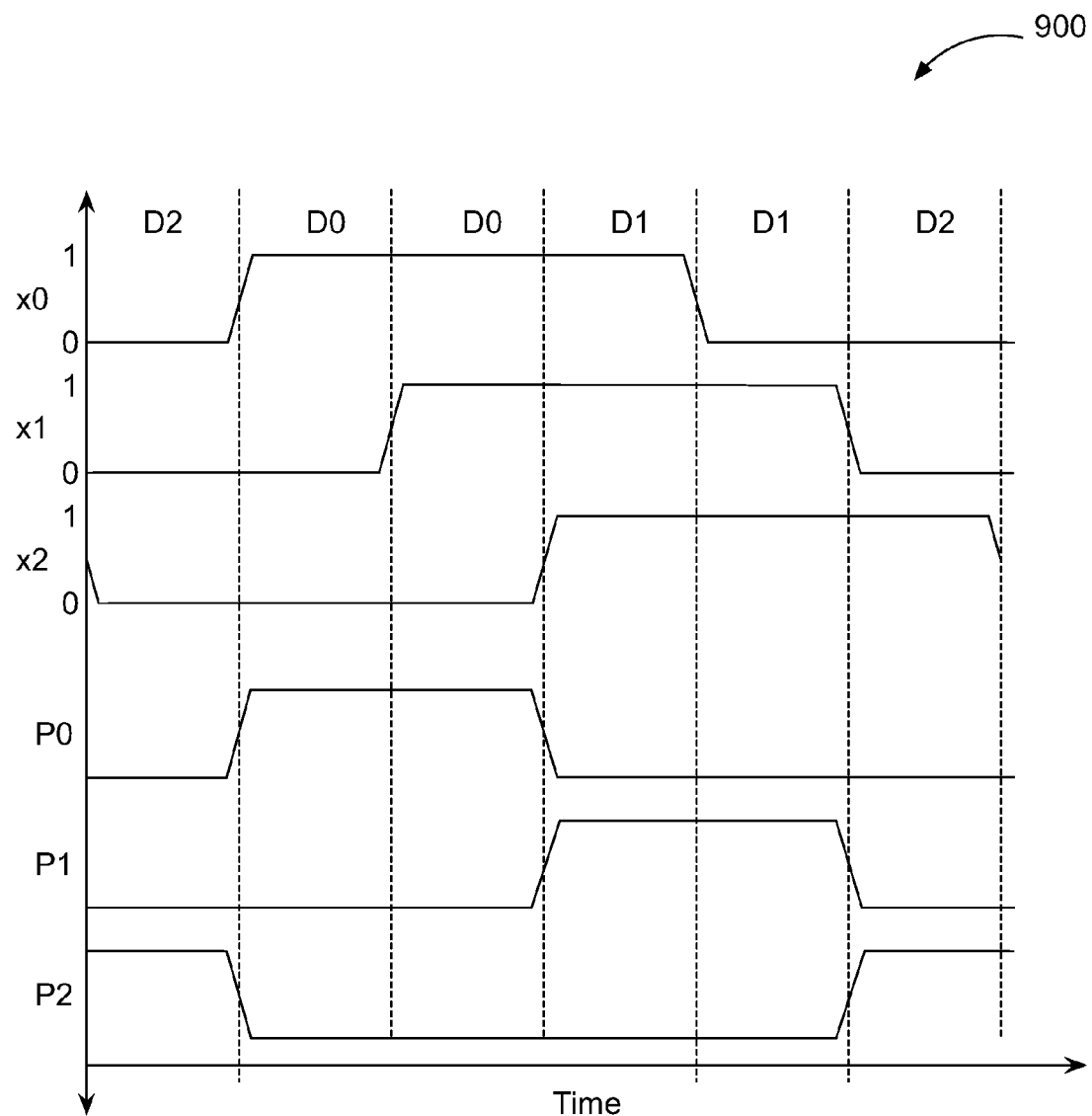
FIG. 9A illustrates timing for a multi-phase ground-referenced single-ended transmitter comprising three ground-referenced single-ended data drivers, in accordance with one embodiment.

FIG. 9A illustrates timing 900 for a multi-phase GRS transmitter comprising three GRS data drivers, in accordance with one embodiment. In the context of the following description, the signals x0, x1, and x2 may each have a 50% duty factor and 120 degree phase spacing relative to each other and may be direct outputs of an oscillator. The signals x0, x1, and x2 may be used to produce the three-phase signals P0, P1, and P2.

The P0 signal corresponding to the first phase of the clock signal may be generated as the AND of x0 and inverted x2. The P1 signal corresponding to the second phase of the clock signal may be generated as the AND of x2 and x1. The P2 signal corresponding to the third phase of the clock signal may be generated as the AND of inverted x0 and inverted x1. The.

As with four phases, for each phase Pi there is one GRS data driver and one GRS data receiver for each phase. Each GRS data driver may be configured to discharge a capacitor to the signal line in one phase and precharge the capacitor during at least one of the other two phases. Each GRS data receiver may be configured to integrate during one phase to produce a characterized signal, sense the characterized signal during another phase, and precharge sensing circuitry during the remaining phase. In another embodiment, each GRS data receiver may be configured to sample the signal during one phase to produce a characterized signal, output the characterized signal during another phase, and precharge sensing circuitry during the remaining phase.

Signals that encode of the three-phase clock signal should be forwarded to generate the appropriate phases at the multi-phase GRS data receiver and reduce the effects of fixed-pattern jitter. In one embodiment, the three signals x0, x1, and x2 are transmitted to the multi-phase GRS data receiver with the output signal. In another embodiment, the three phases P0, P1, and P2 are transmitted to the multi-phase GRS data receiver with the output signal.

In one embodiment, the P0 signal may be transmitted with the data by configuring a three-phase GRS transmitter with the data inputs set at D2=1, D1=0, and D0=0. In one embodiment, the P1 signal may be transmitted with the data by configuring a three-phase GRS transmitter with the data inputs set at D2=0, D1=1, and D0=0. In one embodiment, the P2 signal may be transmitted with the data by configuring a three-phase GRS transmitter with the data inputs set at D2=0, D1=0, and D0=1.

In one embodiment only signal that encodes one phase of the three phase clock is transmitted to the multi-phase GRS data receiver and the remaining two phases are generated at the multi-phase GRS data receiver by phase locking or injection locking a three-phase ring oscillator to the forwarded phase. However, when only one phase is transmitted, the multi-phase GRS data receiver is not necessarily able to reject timing noise due to phase mismatch.

Figure 9B:
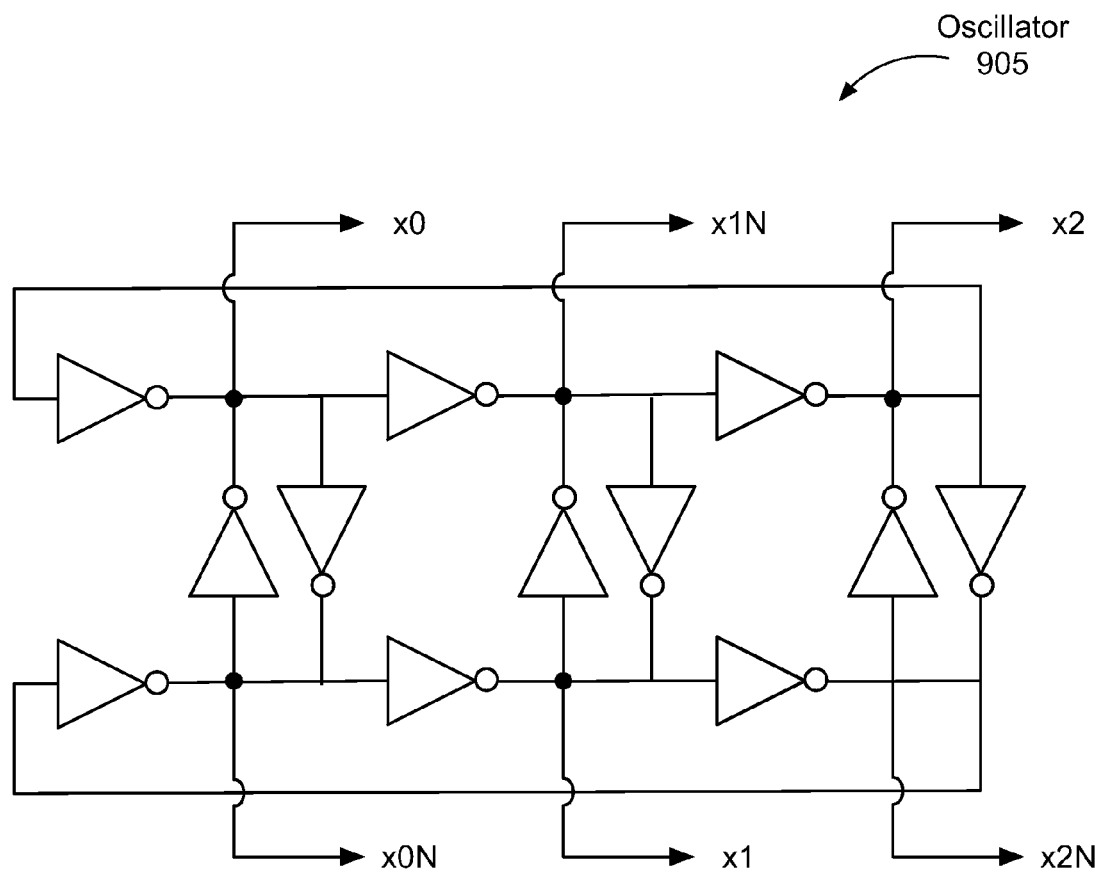
FIG. 9B illustrates a three phase ring oscillator circuit, in accordance with one embodiment.

FIG. 9B illustrates a three-phase ring oscillator circuit 905, in accordance with one embodiment. The signals x0N, x1N, and x2N are the inverted versions of signals x0, x1, and x2, respectively. In one embodiment, the oscillator circuit 905 may be followed by a duty-factor correction circuit configured to adjust each output, so that x0, x1, and x2 each have a 50% duty factor. In one embodiment, the oscillator circuit 905 is followed by a phase correction circuit that adjusts the phase of x0, x1, and/or x2, so that times during which P0, P1, and P2 are logical ones have substantially identical durations.

Figure 10:
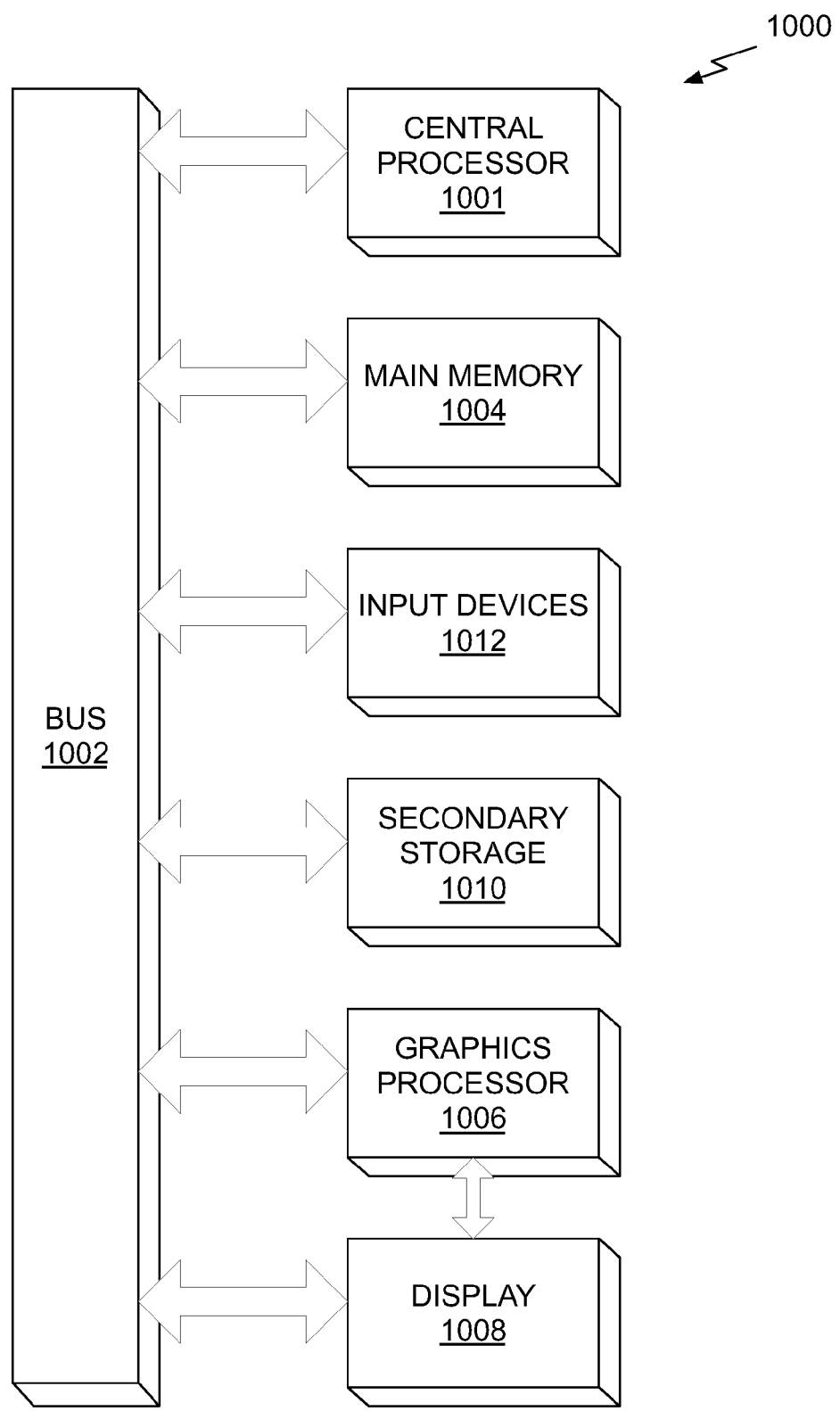
FIG. 10 illustrates an exemplary system in which the various architecture and/or functionality of the various previous embodiments may be implemented.

FIG. 10 illustrates an exemplary system 1000 in which the various architecture and/or functionality of the various previous embodiments may be implemented. As shown, a system 1000 is provided including at least one central processor 1001 that is connected to a communication bus 1002. The communication bus 1002 may be implemented using any suitable protocol, such as PCI (Peripheral Component Interconnect), PCI-Express, AGP (Accelerated Graphics Port), HyperTransport, or any other bus or point-to-point communication protocol(s). The system 1000 also includes a main memory 1004. Control logic (software) and data are stored in the main memory 1004, which may take the form of random access memory (RAM).

The system 1000 also includes input devices 1012, a graphics processor 1006, and a display 1008, i.e. a conventional CRT (cathode ray tube), LCD (liquid crystal display), LED (light emitting diode), plasma display or the like. User input may be received from the input devices 1012, e.g., keyboard, mouse, touchpad, microphone, and the like. In one embodiment, the graphics processor 1006 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 1000 may also include a secondary storage 1010. The secondary storage 1010 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 1004 and/or the secondary storage 1010. Such computer programs, when executed, enable the system 1000 to perform various functions. The main memory 1004, the storage 1010, and/or any other storage are possible examples of computer-readable media.

In one embodiment, the architecture and/or functionality of the various previous figures may be implemented in the context of the central processor 1001, the graphics processor 1006, an integrated circuit (not shown) that is capable of at least a portion of the capabilities of both the central processor 1001 and the graphics processor 1006, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1000 may take the form of a desktop computer, laptop computer, server, workstation, game consoles, embedded system, and/or any other type of logic. Still yet, the system 1000 may take the form of various other devices including, but not limited to a personal digital assistant (PDA) device, a mobile phone device, a television, etc.

Further, while not shown, the system 1000 may be coupled to a network (e.g., a telecommunications network, local area network (LAN), wireless network, wide area network (WAN) such as the Internet, peer-to-peer network, cable network, or the like) for communication purposes.

In one embodiment, certain signals within bus 1002 are implemented as GRS signals, as described above in FIGS. 1A-9B.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
   a control circuit configured to generate a first set of control signals based on a first phase of a clock signal, a second set of control signals based on a second phase of the clock signal, and a third set of control signals based on a third phase of the clock signal;
   a first ground-referenced single-ended signaling (GRS) driver circuit, configured to:
      pre-charge a first capacitor to store a first charge based on the first set of control signals during at least one phase of the clock signal other than the first phase of the clock signal; and
      drive an output signal relative to a ground network by discharging the first charge during the first phase of the clock signal by coupling either a first output node or a second output node to the output signal to transmit a first input;
   a second GRS driver circuit, configured to:
      pre-charge a second capacitor to store a second charge based on the second set of control signals during at least one phase of the clock signal other than the second phase of the clock signal; and
      drive the output signal relative to the ground network by discharging the second charge during the second phase of the clock signal to transmit a second input; and
   a third GRS driver circuit, configured to:
      pre-charge a third capacitor to store a third charge based on the third set of control signals during at least one phase of the clock signal other than the third phase of the clock signal; and
      drive the output signal relative to the ground network by discharging the third charge during the third phase of the clock signal to transmit a third input.

2. The system of claim 1, wherein the control circuit is further configured to generate the first set of control signals based on the first input, the second set of control signals based on the second input, and the third set of control signals based on the third input.

3. The system of claim 1, wherein the first capacitor stores the first charge between the first output node and a first reference node and a polarity of the first charge is based on a logical state of the first input.

4. The system of claim 1, wherein the first capacitor is discharged with a polarity based on a logical state of the first input.

5. The system of claim 1, wherein the first set of control signals are configured to pre-charge the first capacitor with a negative charge when the first input is in a logical zero state during the at least one phase of the clock signal other than the first phase of the clock signal.

6. A system, comprising:
   a control circuit configured to generate a first set of control signals based on a first phase of a clock signal, a second set of control signals based on a second phase of the clock signal, and a third set of control signals based on a third phase of the clock signal, wherein the first set of control signals are configured to pre-charge the first capacitor with a negative charge when the first input is in a logical zero state during the at least one phase of the clock signal other than the first phase of the clock signal;
   a first ground-referenced single-ended signaling (GRS) driver circuit, configured to:
      pre-charge a first capacitor to store a first charge based on the first set of control signals during at least one phase of the clock signal other than the first phase of the clock signal, wherein the first capacitor stores the first charge between a first output node and a first reference node and the first set of control signals are configured to couple the first reference node to a supply node through a first p-channel field-effect transistor (p-FET) and couple the first output node to the ground network through a first n-channel field-effect transistor (n-FET) to pre-charge the first capacitor with the negative charge; and
      drive an output signal relative to a ground network by discharging the first charge during the first phase of the clock signal to transmit a first input;
   a second GRS driver circuit, configured to:
      pre-charge a second capacitor to store a second charge based on the second set of control signals during at least one phase of the clock signal other than the second phase of the clock signal; and
      drive the output signal relative to the ground network by discharging the second charge during the second phase of the clock signal to transmit a second input; and a third GRS driver circuit, configured to:
pre-charge a third capacitor to store a third charge based on the third set of control signals during at least one phase of the clock signal other than the third phase of the clock signal; and
drive the output signal relative to the ground network by discharging the third charge during the third phase of the clock signal to transmit a third input.

7. The system of claim 1, wherein the first set of control signals are configured to pre-charge the first capacitor with a positive charge when the first input is in a logical one state during the at least one phase of the clock signal other than the first phase of the clock signal.

8. The system of claim 7, wherein the first capacitor stores the first charge between the first output node and a first reference node and the first set of control signals are configured to couple the first reference node to the ground network through a first n-channel field-effect transistor (n-FET) and couple the first output node to a supply node through a first p-channel field-effect transistor (p-FET) to pre-charge the first capacitor with the positive charge.

9. The system of claim 1, wherein the first capacitor stores the first charge between the first output node and a first reference node and the first set of control signals are configured to drive the output signal by coupling the first reference node to the ground network and couple the first output node to the output signal during the first phase of the clock signal.

10. The system of claim 9, wherein the first set of control signals are configured to couple the first reference node to the ground network through a first re-channel field-effect transistor (n-FET) and couple the first output node to the output signal through a second n-FET during the first phase of the clock signal to drive the output signal.

11. The system of claim 1, wherein a set of signals that encode the first phase of the clock signal, the second phase of the clock signal, and the third phase of the clock signal are transmitted with the output signal.

12. The system of claim 11, wherein the set of signals comprise an in-phase clock signal and a quadrature clock signal.

13. The system of claim 11, wherein the set of signals comprise a first clock phase signal representing the first phase of the clock, a second clock phase signal representing the second phase of the clock, and a third clock phase signal representing the third phase of the clock.

14. The system of claim 1, further comprising a first GRS receiver circuit that is coupled to the output signal and configured to characterize the output signal during the first phase of the clock signal.

15. The system of claim 14, wherein the characterized output signal is produced by integrating the output signal during the first phase of the clock signal.

16. The system of claim 14, wherein the first GRS receiver circuit is further configured to:
sense the characterized output signal during the second phase of the clock signal; and
pre-charge sensing circuitry during at least one phase of the clock signal other than the first phase and the second phase of the clock signal.

17. The system of claim 14, wherein the characterized output signal is produced by sampling the output signal during the first phase of the clock signal.

18. The system of claim 17, further comprising determining a time at which the output signal is sampled by interpolating between a rising edge and a falling edge that define the first phase of the clock signal.

19. The system of claim 1, wherein the control circuit is further configured to generate a fourth set of control signals based on a fourth phase of the clock signal, and further comprising:
a fourth GRS driver circuit, configured to:
pre-charge a fourth capacitor to store a fourth charge based on the fourth input data signal during at least one phase of the clock signal other than the fourth phase of the clock signal; and
drive the output signal relative to the ground network by discharging the fourth charge during the fourth phase of the clock signal.

20. A method for generating an output signal, comprising:
pre-charging a first capacitor to store a first charge during at least one phase of the clock signal other than the first phase of the clock signal; and
driving the output signal relative to a ground network by discharging the first charge during a first phase of the clock signal by coupling either a first output node or a second output node to the output signal, wherein the output signal is a ground-referenced single-ended signal;
pre-charging a second capacitor to store a second charge during at least one phase of the clock signal other than a second phase of the clock signal; and
driving the output signal relative to the ground network by discharging the second charge during the second phase of the clock signal; and
pre-charging a third capacitor to store a third charge during at least one phase of the clock signal other than a third phase of the clock signal; and
driving the output signal relative to the ground network by discharging the third charge during the third phase of the clock signal.

21. The method of claim 20, further comprising generating a first set of control signals based on the first phase of a clock signal, a second set of control signals based on the second phase of the clock signal, and a third set of control signals based on the third phase of the clock signal, wherein the first capacitor is pre-charged based on the first set of control signals, the second capacitor is pre-charged based on the second set of control signals, and the third capacitor is pre-charged based on the third set of control signals.

22. The method of claim 20, wherein the driving of the output signal during the first phase of the clock signal comprises coupling the first output node associated with the first capacitor to the output signal, and coupling a first reference node associated with the first capacitor to a ground network.

23. The method of claim 20, further comprising transmitting a set of signals that encode the first phase of the clock signal, the second phase of the clock signal, and the third phase of the clock signal with the output signal.

* * * * *